(12) United States Patent
Jeon et al.

(10) Patent No.: US 10,325,944 B2
(45) Date of Patent: Jun. 18, 2019

(54) DISPLAY DEVICE AND MANUFACTURING METHOD THEREOF

(71) Applicant: Samsung Display Co., Ltd., Yongin-si, Gyeonggi-Do (KR)

(72) Inventors: Young Jae Jeon, Daejeon (KR); Jae-Hyun Park, Yongin-si (KR); Sang Ju Lee, Seoul (KR); Jae Ho Choi, Asan-si (KR); Hye Won Hyeon, Anseong-si (KR)

(73) Assignee: Samsung Display Co., Ltd. (KR)

( * ) Notice: Subject to any disclaimer, the term of this patent is extended or adjusted under 35 U.S.C. 154(b) by 4 days.

(21) Appl. No.: 15/840,838

(22) Filed: Dec. 13, 2017

(65) Prior Publication Data

US 2018/0108689 A1  Apr. 19, 2018

Related U.S. Application Data

(63) Continuation of application No. 15/068,368, filed on Mar. 11, 2016, now Pat. No. 9,865,628.

(30) Foreign Application Priority Data

Aug. 27, 2015 (KR) .................. 10-2015-0120813

(51) Int. Cl.
| | |
|---|---|
| *G02F 1/1362* | (2006.01) |
| *G02F 1/1341* | (2006.01) |
| *H01L 27/32* | (2006.01) |
| *H01L 29/786* | (2006.01) |
| *H01L 21/336* | (2006.01) |
| *H01L 27/12* | (2006.01) |
| *G02F 1/1343* | (2006.01) |

(52) U.S. Cl.
CPC .... *H01L 27/1288* (2013.01); *G02F 1/134363* (2013.01); *G02F 1/136286* (2013.01); *H01L 27/124* (2013.01)

(58) Field of Classification Search
CPC .......... G02F 1/134363; G02F 1/13458; H01L 27/1288; H01L 27/124
See application file for complete search history.

(56) References Cited

U.S. PATENT DOCUMENTS

| | | | |
|---|---|---|---|
| 2001/0024247 A1* | 9/2001 | Nakata | G02F 1/1333 349/43 |
| 2004/0095544 A1 | 5/2004 | Chang et al. | |
| 2004/0195574 A1 | 10/2004 | Ahn et al. | |
| 2006/0199314 A1* | 9/2006 | Chen | H01L 29/66765 438/149 |

(Continued)

FOREIGN PATENT DOCUMENTS

| | | |
|---|---|---|
| KR | 10-2000-0061175 A | 10/2000 |
| KR | 10-2012-0090368 A | 8/2012 |
| KR | 10-2013-0120168 A | 11/2013 |

*Primary Examiner* — Brian Turner
(74) *Attorney, Agent, or Firm* — Innovation Counsel LLP

(57) ABSTRACT

The present inventive concept relates to a display device and a manufacturing method thereof. A display device according to an exemplary embodiment of the present inventive concept includes: a substrate; a first gate conductor provided on the substrate; and a gate insulator provided on the first gate conductors, wherein edges of the first gate conductor are recessed from edges of the first gate insulator, and the edges of the first gate insulator are respectively parallel with the edges of the first gate conductor.

20 Claims, 26 Drawing Sheets

(56) References Cited

U.S. PATENT DOCUMENTS

| | | | | |
|---|---|---|---|---|
| 2007/0153145 | A1* | 7/2007 | Kim | G02F 1/136286 |
| | | | | 349/41 |
| 2008/0158458 | A1* | 7/2008 | Yang | G02F 1/1368 |
| | | | | 349/43 |
| 2010/0259715 | A1* | 10/2010 | Tanaka | G02F 1/1345 |
| | | | | 349/143 |
| 2011/0143504 | A1* | 6/2011 | Yang | G02F 1/1368 |
| | | | | 438/156 |
| 2012/0038874 | A1* | 2/2012 | Kim | H01L 27/12 |
| | | | | 349/138 |
| 2013/0069061 | A1 | 3/2013 | Nakazawa | |
| 2013/0286332 | A1 | 10/2013 | Inoue et al. | |

* cited by examiner

DISPLAY DEVICE AND MANUFACTURING METHOD THEREOF

CROSS-REFERENCE TO RELATED APPLICATIONS

This application is a continuation application of U.S. patent application Ser. No. 15/068,368 filed on Mar. 11, 2016, which claims priority to Korean Patent Application No. 10-2015-0120813 filed in the Korean Intellectual Property Office on Aug. 27, 2015, and all the benefits accruing therefrom under 35 U.S.C. § 119, the contents of the prior applications being herein incorporated by reference.

BACKGROUND (a) Technical Field

The present inventive concept relates to a display device and a manufacturing method thereof.

(b) Description of the Related Art

A display device generally includes a pixel including a switching element, a display panel provided with display signal lines, a gate driver transmitting a gate signal to a gate line among the display signal lines to turn the switching element in the pixel on/off, a data driver applying a data voltage to a data line, and a signal controller controlling them.

As one of most commonly used flat display devices, a liquid crystal display device includes two display panels where field generating electrodes such as a pixel electrode, a common electrode, and the like are formed, and a liquid crystal display provided between the two display panels. The liquid crystal display generates an electric field in the liquid crystal layer by applying a voltage to the field generating electrodes, determines a direction of liquid crystal molecules of the liquid crystal layer with the electric field, and controls polarization of incident light to thereby display an image. Transmittance of the liquid crystal display may be increased as the liquid crystal molecules are properly controlled.

At least one pixel electrode included in each pixel of the liquid crystal display is connected with a switching element that is connected with display signal lines such as a gate line, a data line, and the like. The switching element is a three-terminal element such as a thin film transistor and the like, and transmits a data voltage to a pixel electrode.

In the liquid crystal display, the pixel electrode generating an electric field to the liquid crystal layer and the common electrode may be provided in one display panel where a switching element is formed. At least one of the pixel electrode and the common electrode of the liquid crystal display may include a plurality of branch electrodes. When an electric field is generated in the liquid crystal layer, an alignment direction of the liquid crystal molecules in the liquid crystal layer is determined by a fringe field generated by branch electrodes.

A driving circuit such as a gate driver and a data driver may be mounted to the display device as an integrated circuit chip, mounted to the display device as a flexible printed circuit film and thus attached to the display device as a tape carrier package (TCP), or mounted on a printed circuit board. However, recently, a data driver that does not require high mobility of a thin film transistor channel has been integrated to a display panel through the same process as the display signal line and the switching element rather than being formed as an additional chip.

Such a gate driver includes a shift register formed of a plurality of dependently connected stages and a plurality of signal lines transmitting a driving signal to the shift register. The plurality of stages include a plurality of thin film transistors and a capacitor. Each stage is connected to a corresponding gate line, and the plurality of stages sequentially output a gate signal to the respective gate lines according to a predetermined order.

A plurality of patterns of the thin film transistor, the pixel electrode, and the common electrode of the display device may be formed through a photolithography process. In the photolithography process, photo-masks are respectively used according to patterns to be patterned in respective exposure processes.

The above information disclosed in this Background section is only for enhancement of understanding of the background of the inventive concept and therefore it may contain information that does not form the prior art that is already known in this country to a person of ordinary skill in the art.

SUMMARY

The present inventive concept has been made in an effort to reduce the number of exposure processes and the number of photo-masks in a manufacturing process of a display device to thereby simplify the manufacturing process and reduce manufacturing cost.

In addition, according to the present inventive concept, a display failure due to an unnecessary semiconductor layer can be prevented.

A display device according to an exemplary embodiment of the present inventive concept includes: a substrate; a first gate conductor provided on the substrate; and a first gate insulator provided on the first gate conductor, wherein edges of the first gate conductor are recessed from edges of the first gate insulator and the edges of the first gate insulator are respectively parallel with the edges of the first gate conductor.

The display device may further include a common electrode layer provided on the substrate and spaced apart from the first gate conductor in a plan view.

The display device may further include: a first insulating layer provided on the common electrode layer and spaced apart from the first gate conductor in a plan view, wherein an edge of the first insulating layer is protruded from an edge of the common electrode layer by a predetermined distance.

The first gate insulator may cover a first space provided at the periphery of the first gate conductor.

The first insulating layer may cover a second space provided at the periphery of the edge of the common electrode layer.

At least one width of the first space and the second space may be greater than or equal to about 0.5 um.

The display device may further include a first semiconductor provided on the first gate insulator, wherein an edge of the first semiconductor is aligned with the edge of the first gate insulator.

The display device may further include a source electrode and a drain electrode provided on the first semiconductor, wherein the source electrode and the drain electrode are electrically disconnected from the first gate conductor, interposing the first space therebetween.

The source electrode and the drain electrode may be electrically disconnected from the common electrode layer, interposing the second space therebetween.

The display device may further include: a second insulating layer provided on the first insulating layer; and a pixel electrode provided on the second insulating layer, wherein the pixel electrode may be connected with the drain electrode through a contact hole formed in the second insulating layer.

The display device may further include a second insulating layer provided on the first insulating layer, wherein the second insulating layer, the first semiconductor, and the first gate insulator may include a first contact hole that overlaps the first gate conductor.

The display device may further include: a drain electrode provided on the first insulating layer; and a connecting member provided on the second insulating layer, wherein the second insulating layer may include a second contact hole overlapping the drain electrode, and the connecting member electrically may connect the first gate conductor and the drain electrode through the first contact hole and the second contact hole.

The display device may further include a common voltage line provided on the substrate and transmitting a common voltage, wherein the common electrode layer may not overlap a part of the common voltage line and the periphery of the common voltage line.

The display device may further include a second insulating layer provided on the first insulating layer, wherein the second insulating layer and the first insulating layer comprise edges that partially do not overlap the common electrode layer and may be provided on an upper surface of the common electrode layer.

The display device may further include: a second gate conductor provided on the substrate; and a second gate insulator provided on the second gate conductor, wherein the common electrode and the first insulating layer may cover the second gate conductor and the second gate insulator.

The second gate insulator may cover a first space provided at the periphery of the second gate conductor.

The second gate conductor may be connected with the first gate conductor.

The common electrode layer may include a portion that contacts the upper surface of the substrate.

According to another exemplary embodiment of the present inventive concept, a method for manufacturing a display device is provided. The method includes: sequentially forming a gate conductive layer, a gate insulating layer, and a semiconductor layer on a substrate; forming a first mask pattern on the semiconductor layer, the first mask pattern including a first portion, a second portion of which a thickness of the first mask pattern is thinner than a thickness of the first mask pattern in the first portion and a third portion of which a thickness of the first mask pattern is thinner than a thickness of the second mask pattern in the second portion; forming a plurality of semiconductor patterns and a plurality of gate insulators by etching the semiconductor layer and the gate insulating layer using the first mask pattern as an etching mask; and forming a plurality of gate conductors by etching the gate conductive layer using the first mask pattern as an etching mask after etching the semiconductor layer and the gate insulating layer, wherein when forming the plurality of gate conductors, the gate conductive layer is undercut to have a recessed portion along edges of the plurality of semiconductor patterns and the plurality of gate insulators.

The method may further include: forming a second mask pattern by removing the second portion of the first mask pattern after forming the plurality of gate conductors to expose the plurality of semiconductors, wherein the second portion of the mask pattern corresponds to a mask pattern on a gate line; and removing the exposed plurality of semiconductors on the gate line.

The method may further include sequentially forming a common electrode layer and a first insulating layer on an entire surface of the substrate after removing the exposed plurality of semiconductors; and removing the second mask pattern and the common electrode layer and the first insulating layer disposed on the second mask pattern.

The method may further include removing the common electrode layer under the first insulating layer to be undercut to have a recessed portion along an edge of the first insulating layer.

The method may further include: forming a plurality of data conductors on the first insulating layer; forming a second insulating layer on the data conductors; and forming a plurality of contact holes that expose the data conductors or the gate conductors by etching the second insulating layer or etching the first and second insulating layers.

When etching the second insulating layer, a part of the semiconductor pattern and a part of the gate insulator may be etched together.

The method may further include forming a pixel electrode layer on the second insulating layer.

A display device according to an exemplary embodiment of the present inventive concept includes: a substrate; a gate conductor provided on the substrate; an island shaped gate insulator provided on the gate conductor; a semiconductor layer formed on the island shaped gate insulator; a source electrode and a drain electrode electrically connected to the semiconductor layer; and a pixel electrode connected to the drain electrode.

The gate conductor may be recessed from an edge of the island shaped gate insulator in a plan view. A recessed portion of the gate conductor may form a space along an edge of the island shaped gate insluting layer.

The space may form an air gap in which no insulating layer is formed.

The display device may further include a common electrode layer formed on the substrate and spaced apart from the gate conductor.

The display device may further include a first insulating layer formed on the common electrode layer, wherein the common electrode layer is recessed from an edge of the first insulting layer.

The recessed portion of the common electrode may form a space along an edge of the first insulting layer.

The space may form an air gap in which no insulating layer is formed.

According to the exemplary embodiment of the present inventive concept, the number of exposure processes and the number of photo-masks used in the manufacturing process of the display device can be reduced, thereby simplifying the manufacturing process and reducing manufacturing cost.

Further, a display failure due to an unnecessary semiconductor layer can be prevented.

DETAILED DESCRIPTION OF THE EMBODIMENTS

Figure 1:
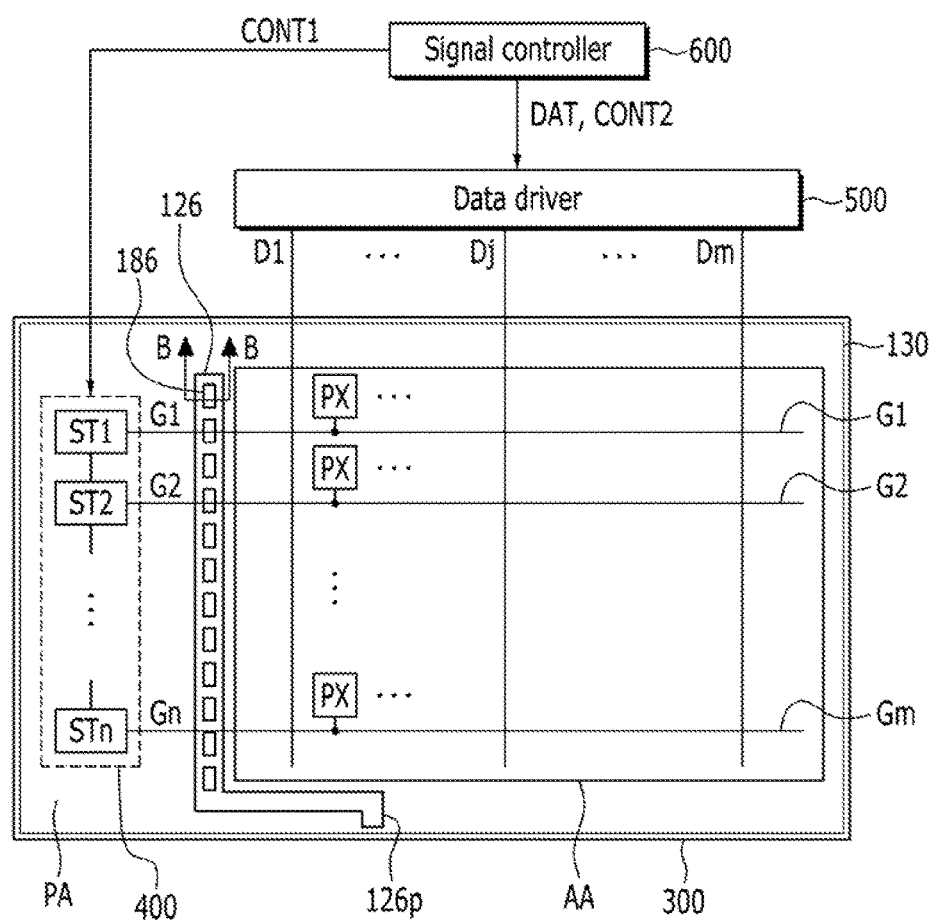
FIG. 1 is a layout view of a display device according to an exemplary embodiment of the present inventive concept.

The present inventive concept will be described more fully hereinafter with reference to the accompanying drawings, in which exemplary embodiments of the inventive concept are shown. As those skilled in the art would realize, the described embodiments may be modified in various different ways, all without departing from the spirit or scope of the present inventive concept.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

The drawings and description are to be regarded as illustrative in nature and not restrictive. Like reference numerals designate like elements throughout the specification.

Throughout this specification and the claims that follow, when it is described that an element is "coupled" to another element, the element may be "directly coupled" to the other element or "electrically coupled" to the other element through a third element. In addition, unless explicitly described to the contrary, the word "comprise" and variations such as "comprises" or "comprising" will be understood to imply the inclusion of stated elements but not the exclusion of any other elements.

Hereinafter, a display device according to an exemplary embodiment of the present inventive concept will be described with reference to FIG. 1.

Referring to FIG. 1, a display device according to an exemplary embodiment of the present inventive concept includes a display panel 300, a gate driver 400, a data driver 500, and a signal controller 600.

The display panel 300 may be a display panel included in various display devices such as a liquid crystal display (LCD), an organic light emitting device (OLED), an electrowetting display (EWD), and the like.

The display panel 300 includes a display area AA displaying an image and a peripheral area PA disposed in the peripheral area of the display area AA.

A plurality of pixels PX connected with a plurality of gate lines G1 to Gn, a plurality of data lines D1 to Dm. A plurality of gate lines G1 to Gn and a plurality of data lines D1 to Dm are disposed in the display area AA.

The gate lines G1 to Gn transmit a gate signal, and may substantially extend in a row direction and be substantially parallel with each other.

The data lines D1 to Dm transmit a data voltage corresponding to an image signal, and may substantially extend in a column direction and be substantially parallel with each other.

The plurality of pixels PX may be arranged in a matrix format.

Each pixel PX may include at least one switching element connected to a gate line Gi and a data line Dj and at least one pixel electrode connected to the at least one switching element. The switching element may be a three-terminal element such as a thin film transistor and the like, integrated with the display panel 300. The switching element is turned on/off according to a gate signal of the gate line Gi, and may transmit a data signal from the data line Dj to the pixel electrode. The switching element may include one or more thin film transistors. A pixel PX may display a corresponding image according to a data voltage applied to the pixel electrode.

The peripheral area PA is a part of a non-display area where no image is displayed in the display device, and may be covered by a light blocking member. The peripheral area PA may surround the display area AA or may be disposed in an edge of the display panel 300.

The gate driver 400 and a plurality of signal wires (not shown) transmitting a driving signal to the gate driver 400 may be disposed in the peripheral area PA. The gate lines G1 to Gn and the data lines D1 to Dm of the display area AA may extend in the peripheral area PA.

The signal controller 600 controls drivers such as the data driver 500 and the gate driver 400.

The signal controller 600 receives input image signals and input control signals that control display of the input image signals from an external graphics controller (not shown). The input control signals, for example, include a vertical synchronization signal, a horizontal synchronizing signal, a main clock signal, a data enable signal, and the like. The signal controller 600 properly processes the input image signal based on the input image signal and the input control signal to convert the input image signal to a digital image signal DAT, and generates a gate control signal CONT1 and a data control signal CONT2. The gate control signal CONT1 includes a scan start signal instructing to start scanning, at least one clock signal controlling an output period of a gate-on voltage Von, and at least one low voltage. The data control signal CONT2 includes a horizontal synchronization start signal informing start of transmission of a digital image signal DAT with respect to pixels PX in a row, a load signal, and a data clock signal.

The signal controller 600 may transmit the data control signal CONT2, the gate control signal CONT1, and the digital image signal DAT to the gate driver 400 and the data driver 500.

The data driver 500 is connected with the data lines D1 to Dm of the display panel 300. The data driver 500 receives the data control signal CON2 and the digital image signal DAT from the signal controller 600 and converts the digital image signal DAT to an analog data signal by selecting a gray voltage corresponding to the digital image signal DAT, and then applies the analog data signal to the corresponding data line D1 to Dm.

The data driver 500 may be mounted on the peripheral area PA of the display panel 300 as a plurality of integrated circuit chips, may be mounted on a flexible printed circuit film and thus attached to the display device as a tape carrier package (TCP), or may be mounted on a printed circuit board connected to the display device. According to another exemplary embodiment of the present inventive concept, the data driver may be integrated on the peripheral area PA of the display panel 300 together with an electric element such as a thin film transistor and the like of the display area AA in the same process.

The gate driver 400 is connected with the gate lines G1 to Gn. The gate driver 400 generates a gate-on voltage Von and a gate-off voltage Voff according to the gate control signal CON1 from the signal controller 600, and applies a gate signal to the gate lines G1 to Gn. The gate-on voltage Von is a voltage that is applied to a gate terminal of the thin film transistor of the display area AA to turn on the thin film transistor, and the gate-off voltage Voff is a voltage that is applied to the gate terminal of the thin film transistor to turn off the thin film transistor.

Referring to FIG. 1, the gate driver 400 according to the exemplary embodiment of the present inventive concept is integrated on the peripheral area PA of the display panel 300. The gate driver 400 may include a plurality of stages ST1 to STn that are sequentially connected to each other.

The plurality of stages ST1 to STn generate a gate signal and sequentially transmit the gate signal to the gate lines G1 to Gn. Each of the stages ST1 to STn include a gate driving circuit connected to the respective gate lines G1 to Gn, and each stage ST1 to STn may include a gate output terminal (not shown) outputting a gate signal to the gate lines G1 to Gn.

The stages ST1 to STn of the gate driver 400 may be disposed in the left or right peripheral area PA of the display panel 300, and are arranged along a column direction. In FIG. 1, the plurality of stages ST1 to STn are disposed in the left-side peripheral area PA of the display panel 300, but this is not restrictive. The plurality of stages ST1 to STn may be disposed on at least one of the top, bottom, left, and right peripheral area PA with reference to the display area AA.

According to the exemplary embodiment of the present inventive concept, each stage ST1 to STn may be connected with an output terminal of the previous or next stage. The first stage ST1 having no previous stage receives a scan start signal that informs start of one frame. The last stage STn having no next stage receives another signal rather than being connected to an output terminal of the next stage.

Each stage ST1 to STn may include a plurality of thin film transistors and at least one capacitor integrated to the peripheral area PA of the display panel 300. The thin film transistor and the capacitor included in the gate driver 400 may be manufactured through the same process as the thin film transistor included in the pixel PX of the display area AA.

Next, a detailed structure of the display panel 300 will be described with reference to FIG. 2 to FIG. 7, together with FIG. 1.

The display panel 300 includes a lower panel 100, an upper panel 200, and a liquid crystal layer 3. The lower panel 100 and the upper panel 200 face each other and the liquid crystal layer 3 is provided between the two panels 100 and 200.

First, the lower panel 100 will be described.

A plurality of gate conductors including a plurality of gate lines 121, a common voltage line 126, and gate electrodes 124 and 124A are provided on a first substrate 110 including an insulating material such as glass, plastic, and the like.

The gate line 121 transmits a gate signal, and includes an end portion 129 connected with the gate driving circuit. The gate line 121 may substantially extend in a horizontal direction. The end portion of the gate line 121 may be provided at the peripheral area (PA).

The gate electrode 124 is disposed in the display area AA and is connected with the gate line 121.

The common voltage line 126 transmits a common voltage, and includes an end portion 126p for receiving the common voltage. Referring to FIG. 1, the common voltage line 126 may be disposed in the peripheral area PA, and may substantially extend in a vertical direction. The common voltage line 126 may extend along the edge of the display area AA. Alternatively, the common voltage line 126 may be disposed in the display area AA.

The gate electrode 124A is disposed in the peripheral area PA.

A plurality of gate insulators are provided on the gate conductor. The plurality of gate insulators include a first gate insulator 141 disposed on the gate line 121, a second gate insulator 144 disposed on the gate electrodes 124 and 124A, and a third gate insulator 149 disposed on the end portion 129 of the gate line 121.

The gate insulators 141, 144, and 149 may have an island shape disposed on the gate conductors such as the gate line 121, the gate electrodes 124 and 124A, and the end portion 129 of the gate line 121, or may extend along the gate conductors.

The gate insulators 141, 144, and 149 may extend or be formed along the gate conductors respectively provided therebelow and completely cover edges of the gate conductors. Edges of the gate conductor are completely covered by edges of the gate insulators 141, 144, and 149 that are disposed thereabove. A distance between an edge of the gate conductor and an edge of the gate insulators 141, 144 and 149 may be uniform. Hereinafter, when one constituent element is disposed at an inner or outer side of an edge of another constituent element, it implies that an edge of the constituent element is disposed at an inner or outer side with reference to the edge of the another constituent. When the constituent element is disposed at an inner side with reference to the edge of the another constituent, the constituent element is positioned above the another constituent element without overlapping the edge of the another constituent. That is, the edges of the gate insulators 141, 144, and 149 are substantially in parallel with the edges of the gate conductors covered by the gate insulators 141, 144, and 149. Further, the gate insulators 141, 144, and 149 may cover the gate conductors 121, 124, 124A, and 129 disposed therebelow and spaces SA that surround the peripheral area of the gate conductors 121, 124, 124A, and 129. The respective spaces SA may be continuously formed along the edges of the neighboring gate conductors 121, 124, 124A, and 129. The respective spaces SA may form an air gap in which no insulating layer is formed.

The width of the space SA disposed at the periphery of one edge of the gate conductors 121, 124, 124A, 129 may be greater than or equal to about 0.5 um. The width of the space SA may be changed according to the width of the gate conductors 121, 124, 124A, and 129, but may be less than or equal to about 1.0 um.

The gate insulator may not be disposed on either a part of the common voltage line 126 or the end portion 126$p$ of the common voltage line 126. However, the gate insulator may or may not exist on other portion of the common voltage line 126. When the gate insulator exists on a part of the common voltage line 126, an empty space covered by the gate insulator may be provided at the periphery of the part of the common voltage line 126.

A semiconductor pattern including a first semiconductor 154 and a second semiconductor 159 is disposed on a part of the gate insulators 141, 144, and 149.

The first semiconductor 154 is disposed on the second gate insulator 144. The first semiconductor 154 may substantially have the same plane shape as the second gate insulator 144, and may have an island shape. The edge of the first semiconductor 154 may be substantially aligned with the edge of the second gate insulator 144. Thus, the first semiconductor 154 may completely covers the edges of the gate electrode 124 provided therebelow, and the edge of the gate electrode 124 is recessed from an edge of the first semiconductor 154 by a predetermined distance. Accordingly, the first semiconductor 154 may cover the gate electrode 124 and the space SA surrounding the periphery of the gate electrode 124. The predetermined distance, that is the width of the space SA, may be equal to or greater than about 0.5 μm and equal to or less than about 1.0 μm.

According to an exemplary embodiment of the present inventive concept, the first semiconductor 154 may be formed only in an area corresponding to where the gate electrode 124 is formed.

A structure that is similar to the second gate insulator 144 and the first semiconductor 154 may be provided on the gate electrode 124A that is disposed in the peripheral area PA.

The second semiconductor 159 is disposed on the third gate insulator 149. The second semiconductor 159 may have an island-like shape disposed only on the end portion 129 of the gate line 121. An outer edge of the second semiconductor 159 may be substantially aligned with an edge of the third gate insulator 149. Accordingly, an edge of the end portion 129 of the gate line 121 may be disposed at an inner side of an outer edge of the second semiconductor 159. The edge of the end portion 129 of the gate line 121 may be recessed from the outer edge of the second semiconductor 159 by a predetermined distance. Thus, the second semiconductor 159 may cover the end portion 129 of the gate line 121 and the space SA surrounding the periphery of the end portion 129. The predetermined distance may be equal to or greater than about 0.5 μm and equal to or less than about 1.0 μm.

The third gate insulator 149 and the second semiconductor 159 disposed in the end portion 129 of the gate line 121 may be omitted as necessary.

The semiconductor pattern may not be disposed on the gate line 121 and at least a part of the common voltage line 126.

Although not illustrated, when the gate insulator exists on a part of the common voltage line 126, the semiconductor pattern may not be dispose on the gate insulator like on the gate line 121.

The semiconductor pattern, which includes the first and second semiconductors 154 and 159, may be amorphous silicon, polysilicon, or an oxide semiconductor.

A common electrode layer 130 may be disposed on substantially entire surface of the first substrate 110. The common electrode layer 130 may be made of a transparent conductive material such as ITO, IZO, and the like.

The common electrode layer 130 does not overlap a part of the gate conductor but may overlap another part of the gate conductor. The edge of the gate conductor at a location where the common electrode layer 130 does not overlap the gate conductor is separated by a constant distance from the edge of the common electrode layer 130. Further, the common electrode layer 130 may be separated by a predetermined distance from the edge side of the gate conductor and the semiconductor pattern provided thereabove in a location where the semiconductor pattern is positioned on the gate conductor.

Figure 4:
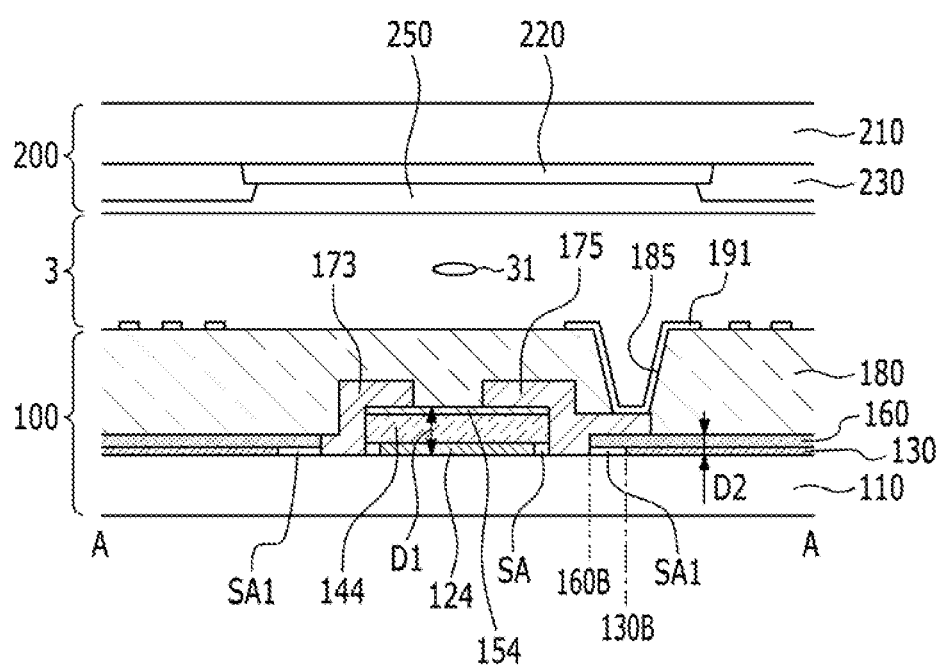
FIG. 4 is a cross-sectional view of the display device of FIG. 2, taken along the line A-A.

Specifically, referring to FIG. 4, edges of the gate electrode 124, the second gate insulator 144 above the gate electrode 124, and the first semiconductor 154 are separated by a predetermined distance from the edge side of the common electrode 130 disposed at the periphery thereof. A structure of the periphery of the gate electrode 124A disposed in the peripheral area PA may be the same as the structure of the periphery of the gate electrode 124.

Figure 5:
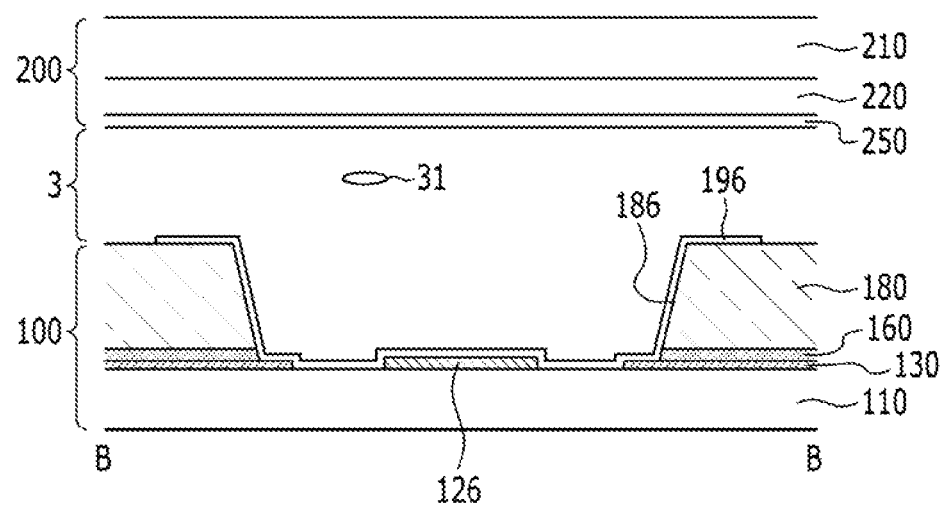
FIG. 5 is a cross-sectional view of the display device of FIG. 1, taken along the line B-B.

Referring to FIG. 5, a part of the common voltage line 126 and/or the end portion 126$p$ (shown in FIG. 1) of the common voltage line 126 are separated by a predetermined distance from the edge of the common electrode 130 positioned at the periphery thereof.

Figure 6:
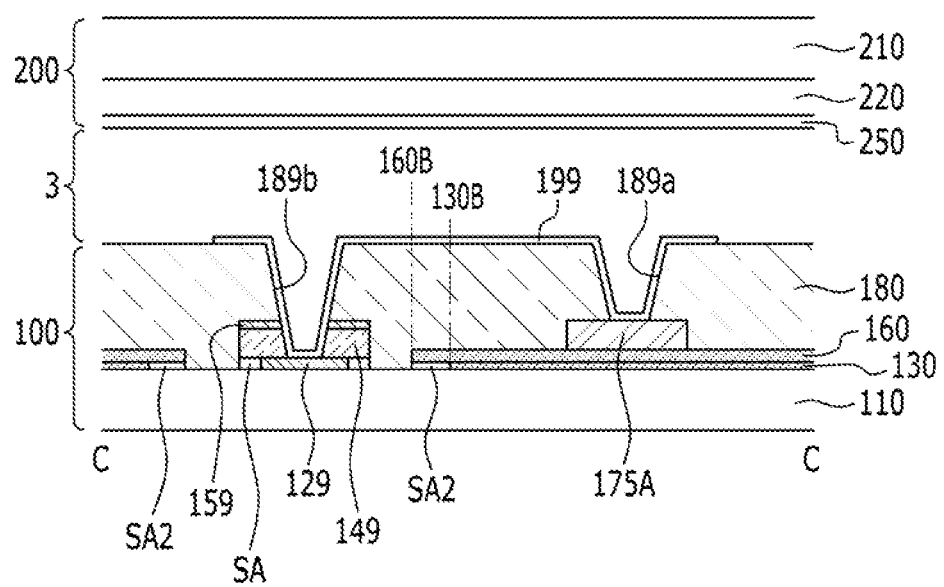
FIG. 6 is a cross-sectional view of the display device of FIG. 3, taken along the line C-C.

Referring to FIG. 6, the edges of the end portion 129 of the gate line 121 and/or the third gate insulator 149 and the second semiconductor 159 provided above the gate line 121 are separated by a predetermined distance from the edge of the common electrode line 130 disposed at the periphery thereof.

Figure 7:
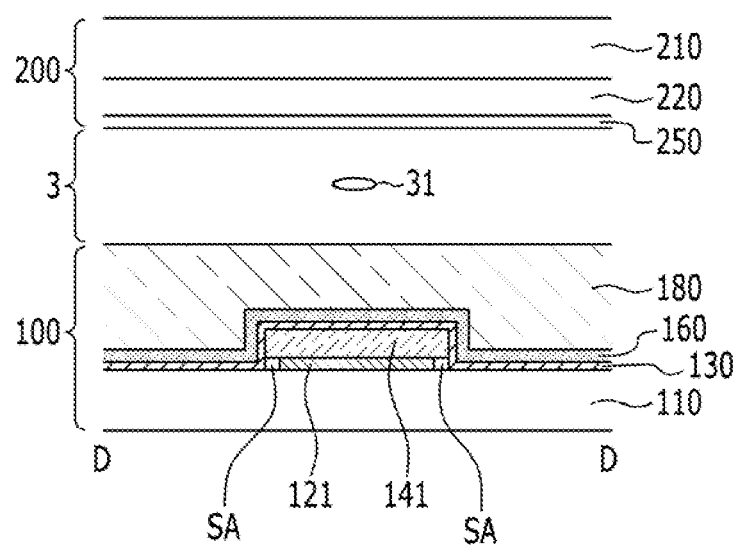
FIG. 7 is a cross-sectional view of the display device of FIG. 2, taken along the line D-D.
Figure 8:
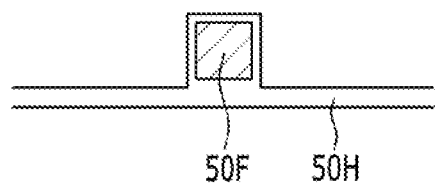
FIG. 8 is a plan view of an intermediate product in one stage of a manufacturing process of a display device according to an exemplary embodiment of the present inventive concept.
Figure 9:
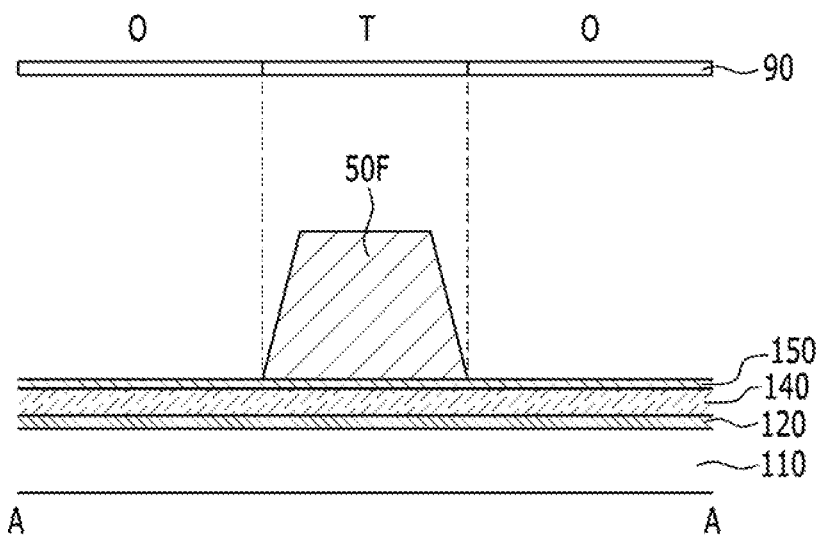
FIG. 9, FIG. 10, FIG. 11, and FIG. 12 are cross-sectional views respectively illustrating the intermediate product in one stage of the manufacturing process according to the exemplary embodiment of the present inventive concept, taken along the lines of A-A, B-B, C-C, and D-D of FIG. 1 to FIG. 3.
Figure 10:
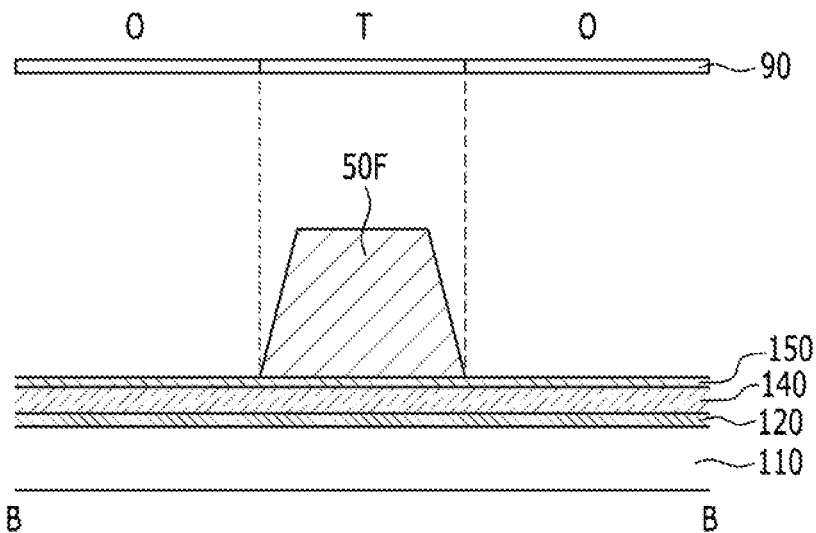
Figure 11:
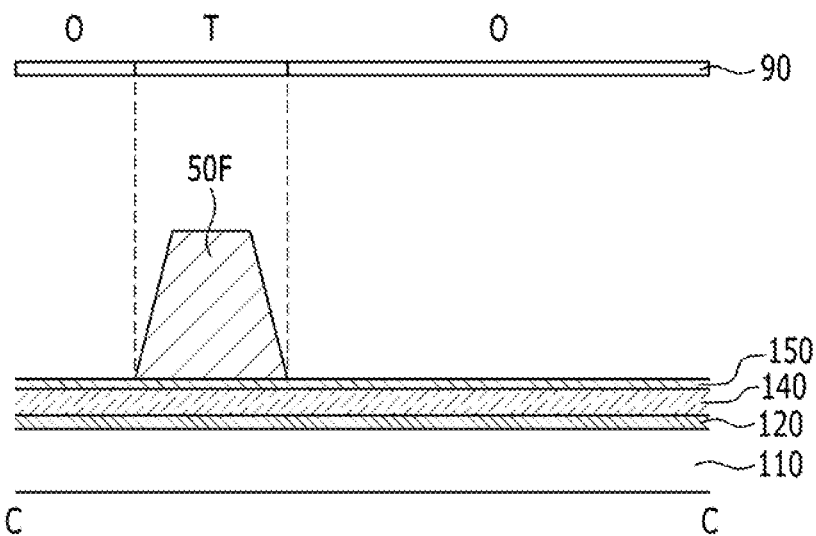
Figure 12:
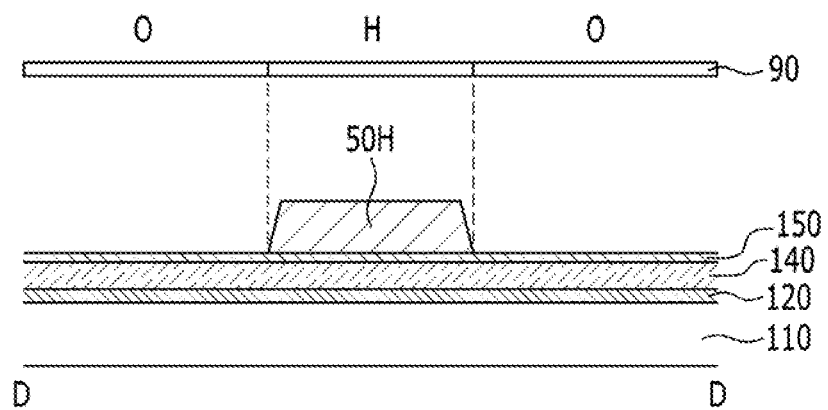
Figure 13:
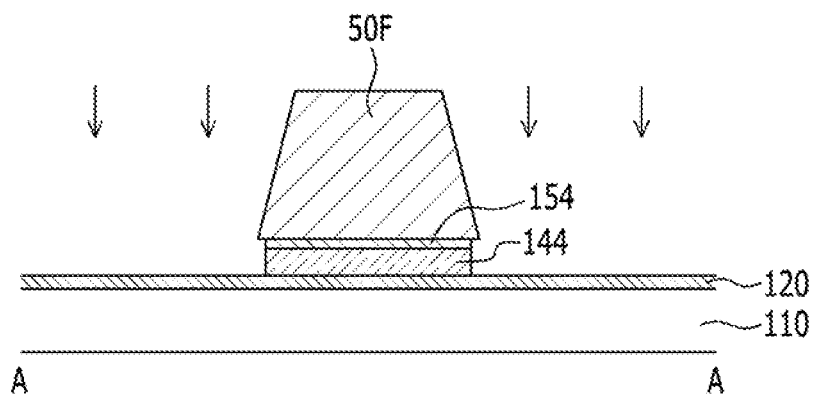
FIG. 13, FIG. 14, FIG. 15, and FIG. 16 are cross-sectional views respectively illustrating the intermediate product in a stage after the stage of FIG. 9, FIG. 10, FIG. 11, and FIG. 12 of the manufacturing process according to the exemplary embodiment of the present inventive concept, taken along the lines of A-A, B-B, C-C, and D-D of FIG. 1 to FIG. 3.
Figure 14:
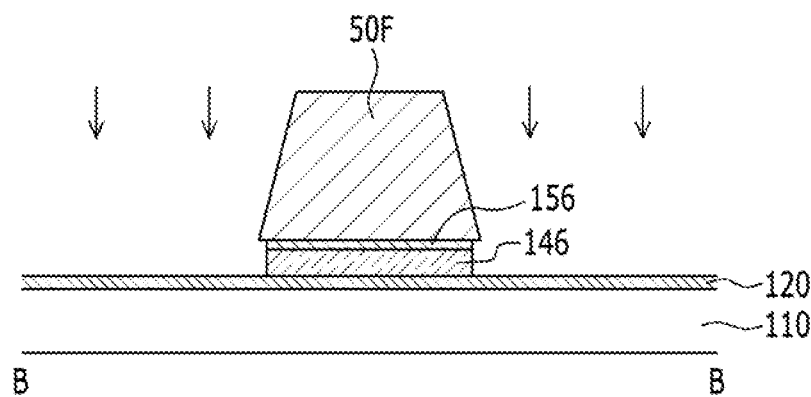
Figure 15:
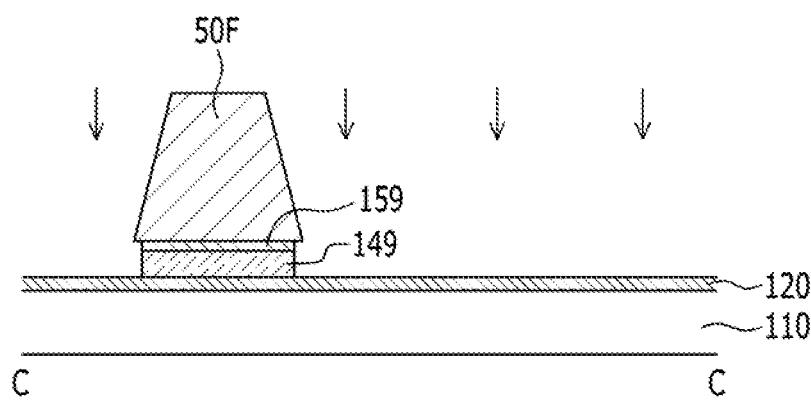
Figure 16:
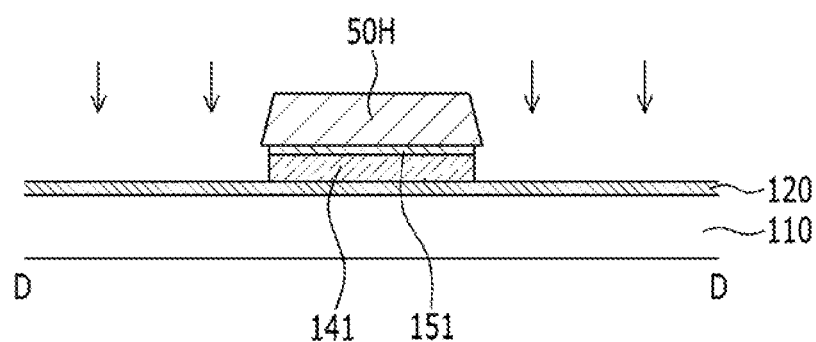
Figure 17:
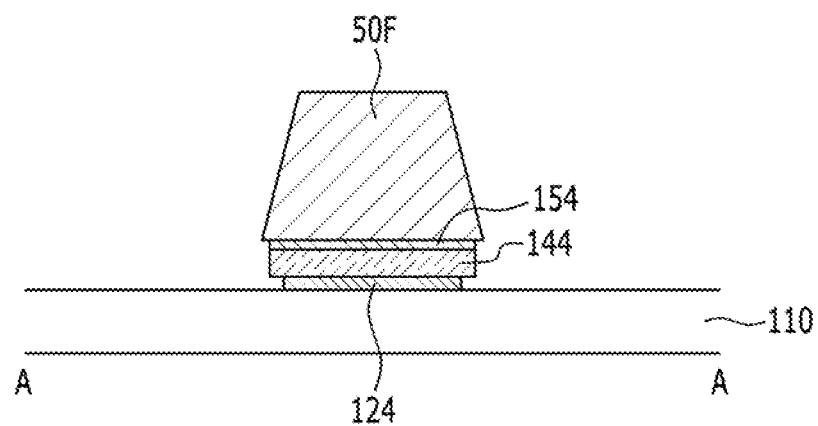
FIG. 17, FIG. 18, FIG. 19 and FIG. 20 are cross-sectional views respectively illustrating the intermediate product in a stage after the stage of FIG. 13, FIG. 14, FIG. 15, and FIG. 16 of the manufacturing process according to the exemplary embodiment of the present inventive concept, taken along the lines of A-A, B-B, C-C, and D-D of FIG. 1 to FIG. 3.
Figure 18:
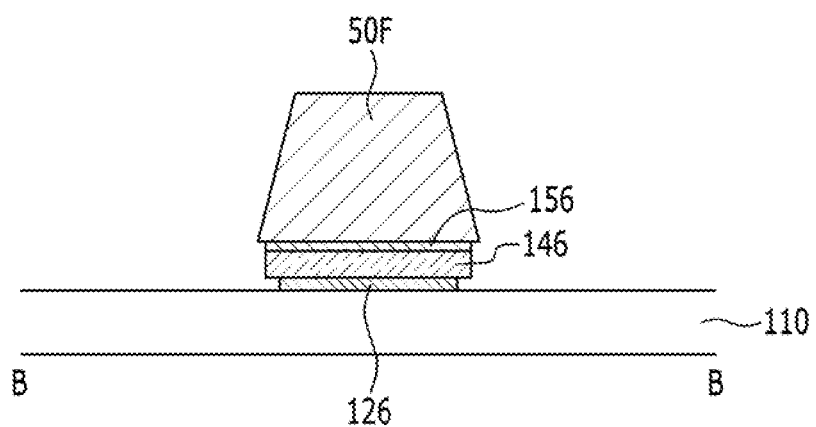
Figure 19:
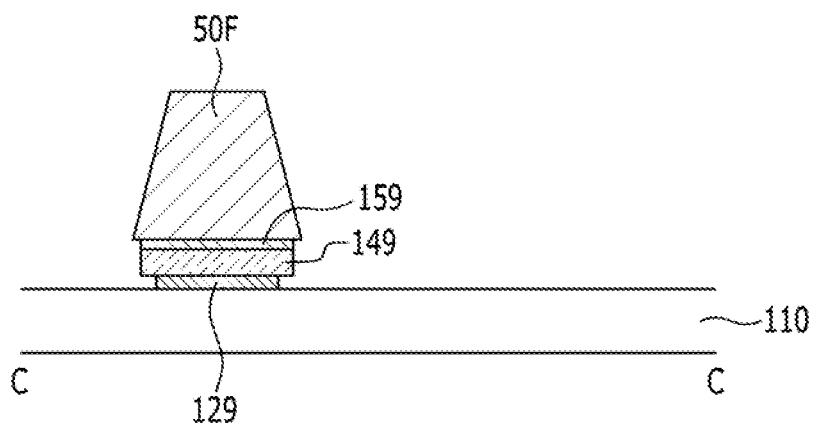
Figure 20:
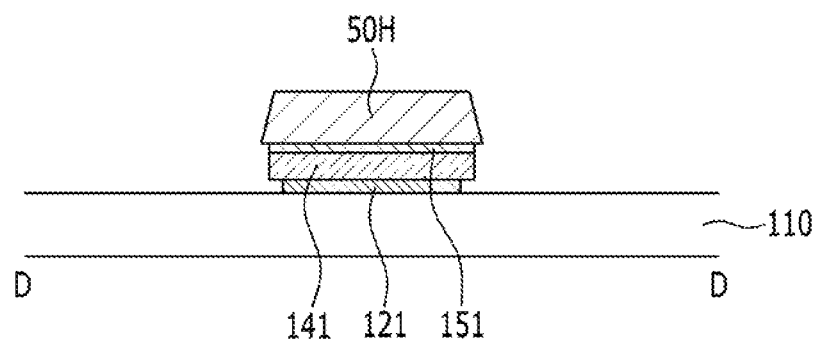
Figure 21:
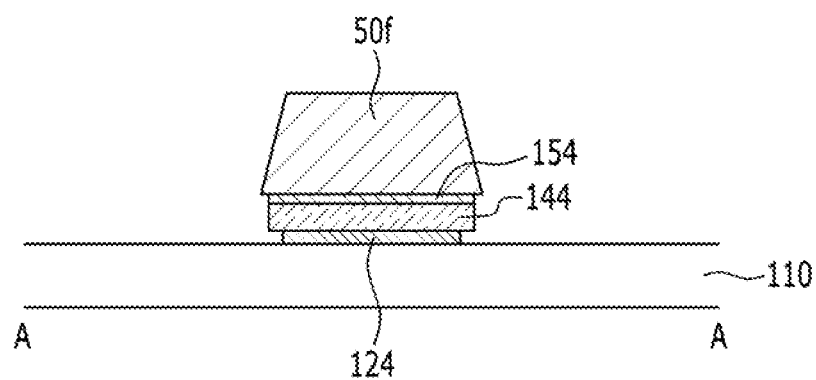
FIG. 21, FIG. 22, FIG. 23 and FIG. 24 are cross-sectional views respectively illustrating the intermediate product in a stage after the stage of FIG. 17, FIG. 18, FIG. 19, and FIG. 20 of the manufacturing process according to the exemplary embodiment of the present inventive concept, taken along the lines of A-A, B-B, C-C, and D-D of FIG. 1 to FIG. 3.
Figure 22:
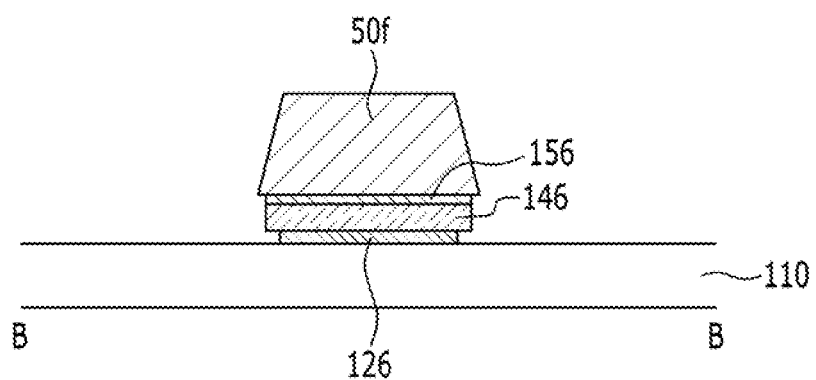
Figure 23:
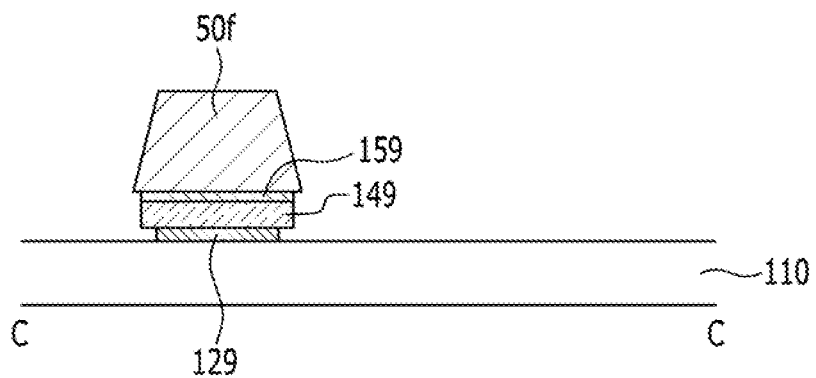
Figure 24:
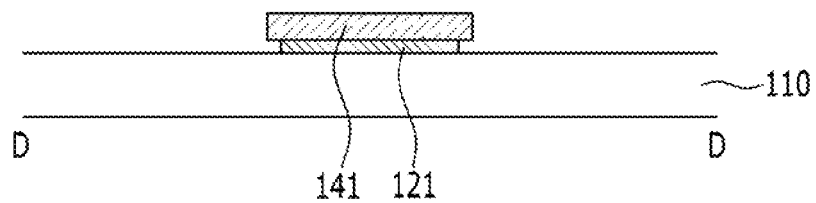

Referring to FIG. 7, the common electrode layer 130 may be disposed on the gate line 121, excluding the gate electrodes 124 and 124A. That is, the common electrode layer 130 may partially cover the gate conductor including the gate line 121. In this case, the common electrode layer 130 may not contact the gate line 121 due to the space SA provided at the periphery of the gate line 121 below the first gate insulator 141.

Although it is not illustrated, another portion of the common voltage line 126 may be separated by a predetermined distance from the edge of the common electrode layer 130 like the portion shown in FIG. 5, or may be covered by the common electrode layer 130. When the common voltage line 126 is partially covered by the common electrode layer 130, the common electrode layer 130 may be separated by an empty space provided at the periphery of the common voltage line 126 and thus may not contact the common voltage line 126 like the structure of the periphery of the gate line 121. In this case, a gate insulator may exist on the common voltage line 126. That is, a peripheral structure of a part of the common voltage line 126 may be the same as the structure of the periphery of the gate line 121.

The common electrode layer 130 may include a portion that contacts the upper surface of the first substrate 110.

A first insulating layer 160 is disposed on the common electrode layer 130. The first insulating layer 160 may include an inorganic insulating material such as SiNx, SiOx, and the like. The first insulating layer 160 is directly disposed on the common electrode layer 130 and thus contacts the common electrode layer 130. The first insulating layer 160 may overlap the common electrode layer 130 in most of the area.

The first insulating layer 160 may be separated from the gate conductor, the gate insulator above the gate conductor, and the semiconductor pattern in an area where the common electrode layer 130 below the first insulating layer 160 is separated from the gate conductor rather than being overlapped with the gate conductor. Specifically, the first insulating layer 160 does not overlap the semiconductor pattern, and the edge of the first insulating layer 160 is separated by a predetermined distance from the edge of the semiconductor pattern.

Specifically, referring to FIG. 4, the first insulating layer 160 is separated from the gate electrodes 124 and the second gate insulator 144 and the first semiconductor 154 disposed above the gate electrode 124, rather than covering them. Particularly, an edge 160B of the first insulating layer 160 is protruded from an edge 130B of the common electrode 130 below the first insulting layer 160 rather than being aligned with the edge side 130B of the common electrode 130. Thus, the first insulating layer 160 disposed at the periphery of the gate electrodes 124 and 124A covers the edge 130B of the common electrode 130 disposed therebelow and a space SA1 that is continuously formed at the edge 130B of the common electrode 130. The space SA1 is continuously formed along the edges of the gate electrodes 124 and 124A and the first semiconductor 154 above the gate electrodes 124 and 124A. Further, the space SA1 may be continuously formed adjacent to the edge 130B of the common electrode layer 130. The space SA1 may form an air gap in which no insulating layer is formed.

The width of the space SA1 positioned at the periphery of the edge side 130B of the common electrode layer 130 may be greater than or equal to about 0.5 um. The width of the space SA1 may be changed according to the width of the common electrode layer 130, but it may be less than or equal to about 1.0 um.

Referring to FIG. 5, the first insulating layer 160 is separated from a part and/or the end portion 126p of the common voltage line 126 rather than covering the same. Particularly, an edge of the first insulating layer 160 may be disposed above the upper surface of the common electrode layer 130 at a partial periphery of the common voltage line 126. Thus, an edge area of the common electrode 130 disposed at the partial periphery of the common voltage line 126 does not overlap with the first insulating layer 160.

Although not illustrated, another portion of the common voltage line 126 may be separated by a predetermined distance from the edge of the first insulating layer 160 as shown in FIG. 5, or may be covered by the first insulating layer 160. Particularly, when a part of the common voltage line 126 is covered by the common electrode layer 130 as in the peripheral structure of the gate line 121, the first insulating layer 160 may be disposed directly above the common electrode layer 130.

Referring to FIG. 6, the first insulating layer 160 is separated from the end portion 129 of the gate line 121 and the third gate insulator 149 and the second semiconductor 159 disposed above the end portion 129 of the gate line 121 rather than covering the same. Particularly, an edge 160B of the first insulating layer 160 is protruded from the edge 130B of the common electrode layer 130 disposed therebelow rather than being aligned with the edge side 130B of the common electrode layer 130. Thus, the first insulating layer 160 disposed at the periphery of the end portion 129 of the gate line 121 covers the edge 130B of the common electrode layer 130 provided therebelow and a space SA2 continuously formed at the periphery of the edge side 130B.

The width of the space SA2 may be greater than or equal to about 0.5 um. The width of the space SA2 may be changed according to the width of the common electrode layer 130, but may be less than or equal to 1.0 um.

The common electrode layer 130 and the first insulating layer 160 include island-shaped holes overlapping the gate electrodes 124 and 124A, the first semiconductor 154, and the peripheral area thereof, island-shaped holes overlapping the end portion of the gate line 121, the second semiconductor 159, and the peripheral area thereof, and island-shaped holes overlapping a part of the common voltage line 126 and the peripheral area thereof. The island-shaped hole included in the first insulating layer 160 includes the edge 160B. The holes of the common electrode layer 130 respectively correspond to the holes formed in the first insulating layer 160. Edges of the holes of the common electrode layer 130 may be provided in an outer side of the edge 160B of the first insulating layer 160 while surrounding the edge 160B. Alternatively, in a partial periphery of the common voltage line 126, edges of the holes of the common electrode layer 130 may be provided at an inner side of the edge of the first insulating layer 160 as shown in FIG. 5.

Referring to FIG. 7, the first insulating layer 160 may be disposed on the gate line 121, excluding the gate electrode 124. That is, the first insulating layer 160 may cover a part of the gate conductor including the gate line 121 and may be positioned directly above the common electrode layer 130.

A structure of a periphery of other portion of the common voltage line 126, not shown in FIG. 5, may be the same as the structure of the periphery of the gate line 121. That is, the first insulating layer 160 may be disposed on another portion of the common voltage line 126.

Referring to FIG. 4, a thickness D1 of the gate conductors 124 and 129, the gate insulators 144 and 149, and the semiconductors 154 and 159 that are sequentially layered may be greater than a thickness D2 of the common electrode 130 and the first insulating layer 160 that are sequentially layered at the periphery of the gate conductors 124 and 129, the gate insulators 144 and 149, and the semiconductors 154 and 159.

A data conductor including a data line 171, source electrodes 173 and 173A, drain electrodes 175 and 175A is disposed on the first insulating layer 160.

Figure 2:
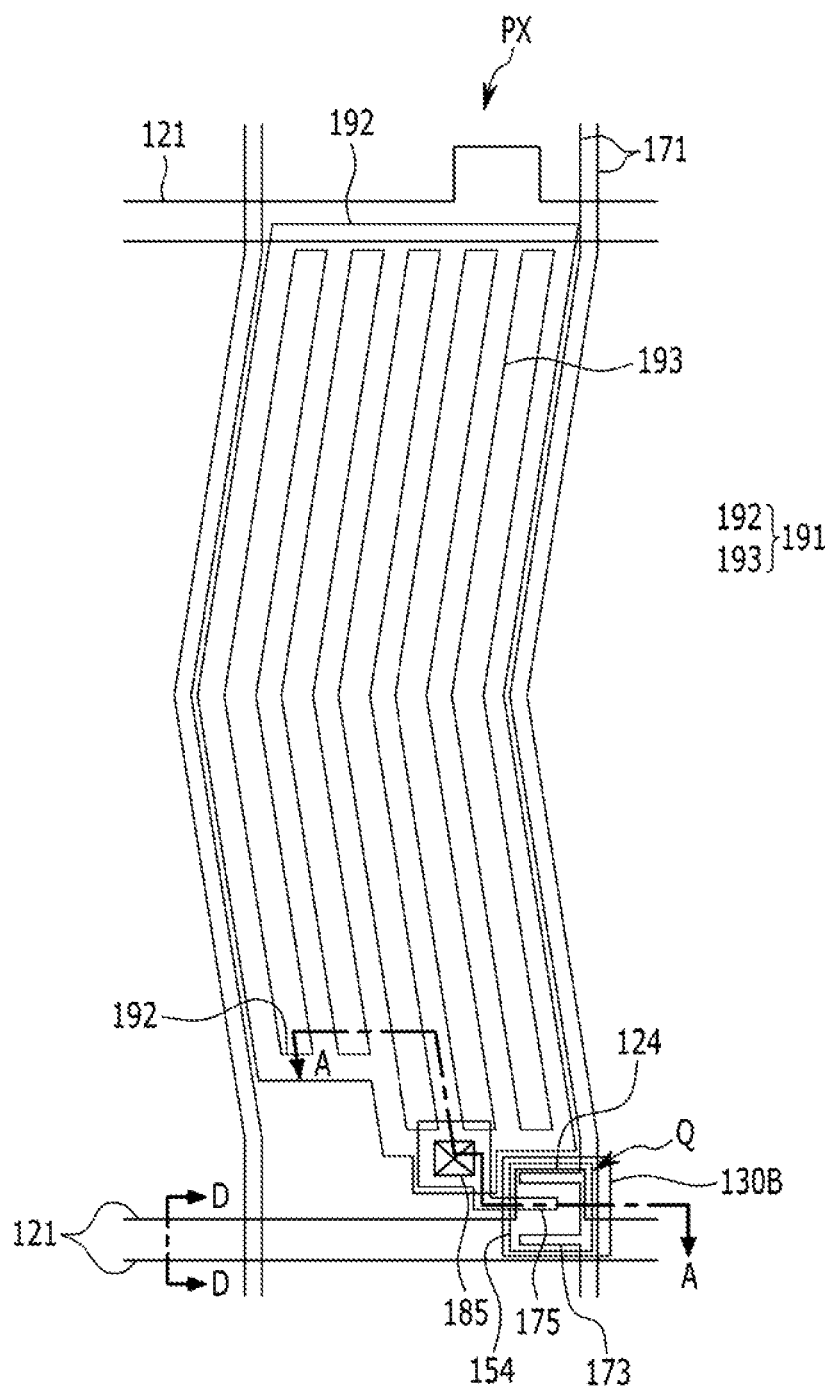
FIG. 2 is a layout view of a pixel of the display device according to the exemplary embodiment of the present inventive concept.

Referring to FIG. 2, the data line 171 substantially extends in a vertical direction, and may be periodically bent. The source electrode 173 is directly connected to the data line 171.

The drain electrode 175 faces the source electrode 173 with respect to the gate electrode 124 and the first semiconductor 154. The source electrode 173 and the drain electrode 175 may contact the upper surface of the first semiconductor 154.

Referring to FIG. 4, since the space SA is disposed at the periphery of the gate electrode 124, the source electrode 173 and the drain electrode 175 are separated from the gate electrode 124.

The gate electrode 124, the source electrode 173, and the drain electrode 175 form a transistor Q together with the first semiconductor that overlaps the gate electrode 124.

Referring to FIG. 6, the source electrode 173A and the drain electrode 175A are provided on the gate electrode 124A and a semiconductor panel disposed at the peripheral area PA, and they face each other. Although not illustrated, since the space SA is provided at the periphery of the gate electrode 124A, the source electrode 173A and the drain electrode 175A are separated from the gate electrode 124A.

The gate electrode 124A, the source electrode 173A, and the drain electrode 175A form a first transistor Tr1 together with the semiconductor patter that overlaps the gate electrode 124A.

A second insulating layer 180 is wholly provided on the data conductor. The second insulating layer 180 may include an inorganic insulating material or an organic insulating material.

Figure 3:
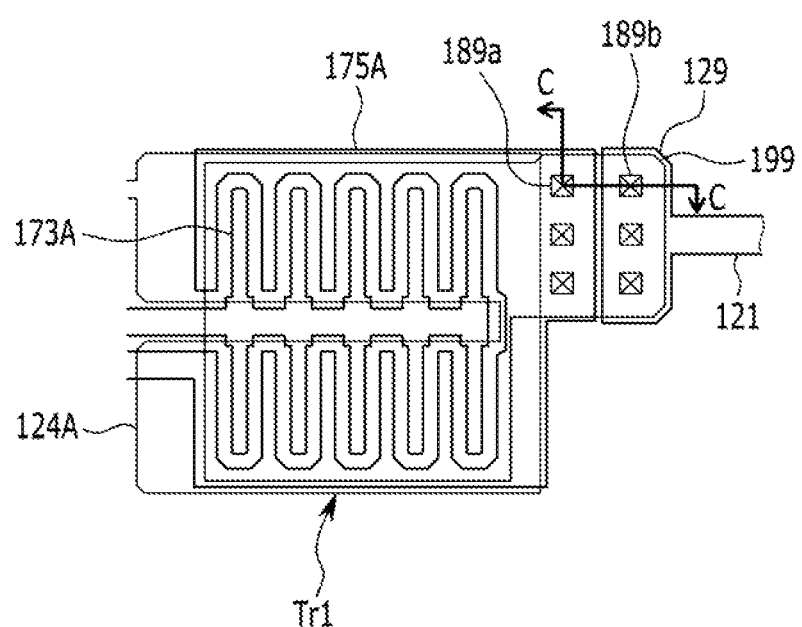
FIG. 3 is a layout view of a transistor included in a driver of the display device according to the exemplary embodiment of the present inventive concept.

Referring to FIG. 2 and FIG. 4, the first insulating layer 160 and the second insulating layer 180 include a contact hole 185 overlapping the drain electrode 175 disposed in the display area AA. Referring to FIG. 1 and FIG. 5, the first insulating layer 160 and the second insulating layer 180 include a contact hole 186 overlapping a part of the common voltage line 126 and the first substrate 110 at the periphery of the first and second insulating layers 160 and 180, and the common electrode layer 130. Referring to FIG. 3 and FIG. 6, the second insulating layer 180 includes a contact hole 189b provided on the end portion 129 of the gate line 121 and a contact hole 189a overlapping the drain electrode 175A. Particularly, the contact hole 189b is extended to the second semiconductor 159 and the third gate insulator 149 such that the end portion 129 of the gate line 121 overlaps the contact hole 189b. That is, the contact hole 189b is formed in the second insulating layer 180, the second semiconductor 159, and the third gate insulator 149 provided on the end portion 129 of the gate line 121.

A pixel electrode layer including a plurality of pixel electrodes 191 and a plurality of connection members 196 and 199 is provided on the second insulating layer 180.

The pixel electrode 191 is electrically connected with the drain electrode 175 through the contact hole 185 and thus receives a data voltage. The pixel electrode 191 may include a plurality of branch electrodes 193 that are extended substantially in parallel with each other while being separated from each other, and upper and lower horizontal portions 192 connecting upper end portions or lower end portions of the respective branch electrodes 193. The branch electrode 193 of the pixel electrode 191 may be bent along the data line 171.

The connection member 196 electrically connects the common voltage line 126 and the common electrode layer 130 through the contact hole 186. Accordingly, the common electrode layer 130 may receive a common voltage from the common voltage line 126.

The connection member 199 electrically connects the end portion 129 of the gate line 121 and the drain electrode 175A of the first transistor Tr1 through the two contact holes 189a and 189b.

In the upper panel 200, a light blocking member 220 and a plurality of color filters 230 may be provided on a second substrate 210 that includes an insulation material such as glass, plastic, and the like. The light blocking member 220 may define a transmissive area of the pixel PX, and each color filter 230 may mostly exist in the transmissive area of the pixel PX. The color filter 230 may display one of primary colors such as three primary colors of red, green, and blue.

Unlike the present exemplary embodiment, at least one of the light blocking member 220 and the color filter 230 may be disposed in the lower panel 100.

An overcoat 250 may further be provided on the light blocking member 220 and the color filter 230.

The liquid crystal layer 3 includes a plurality of liquid crystal molecules 31, and the liquid crystal molecules 31 may be aligned so that long axes thereof are substantially parallel or perpendicular to the surfaces of the two panels 100 and 200 while no electric field is applied.

The pixel electrode 191 received the data voltage through a transistor Q may generate an electric field in the liquid crystal layer 3 together with the common electrode layer 130 that has received the common voltage.

A manufacturing method of a display device according to an exemplary embodiment of the present inventive concept will now be described with reference to FIG. 8 to FIG. 42, together with the above-described drawings.

First, referring to FIG. 8 to FIG. 12, a conductive material such as metal is formed on the first substrate 110 that includes an insulation material to form a gate conductive layer 120. Next, a gate insulating layer 140 is formed by laminating an insulation material such as SiNx, SiOx, and the like on the gate conductive layer 120. Next, a semiconductor layer 150 is formed by laminating a semiconductor material such as an amorphous or to polycrystalline silicon or an oxide semiconductor on the gate insulating layer 140.

Next, a photosensitive material such as a negative photoresist is formed on the semiconductor layer 150 and then mask patterns 50F and 50H are formed through exposure and developing process using a single first photo-mask 90. The thickness of the second mask pattern 50H is thinner than the thickness of the first mask pattern 50F.

The first photo-mask 90 used in the exposure process of the photosensitive material may include a transmissive area T where light is transmitted, a transflective area (half-tone area) H where light is partially transmitted, and a light blocking area O where light is blocked. The first mask pattern 50F having a larger thickness among the mask patterns may be an exposed portion corresponding to the transmissive area T of the first photo-mask 90 and the second mask pattern 50H having a smaller thickness may be an exposed portion corresponding to the transflective area H of the first photo-mask 90. When the photosensitive material has positive photosensitivity, transparency of the first photo-mask 90 corresponding to the mask patterns 50F and 50H may be reversely changed. That is, the positive photoresist corresponding to the transmissive area T of the first photo-mask 90 may have a larger thickness, the positive photoresist corresponding to the transflective area (half-tone area) H of the first photo-mask 90 may have an intermediate thickness, and the positive photoresist corresponding to the light blocking area O of the first photo-mask 90 may have a smaller thickness. Next, referring to FIG. 13 to FIG. 16, the semiconductor layer 150 and the gate insulating layer 140 are etched using the mask patterns 50F and 50H as etching masks. In this case, anisotropic etching, for example, dry-etching such as reactive ion etching, may be used. Accordingly, portions of the semiconductor layer 150 and the gate insulating layer 140, covered by the mask patterns 50F and 50H, are maintained, and other portions are removed such that a plurality of semiconductor patterns including the first semiconductor 154, the second semiconductor 159, a third semiconductor 156, and a fourth semiconductor 151, and a plurality of gate insulators 141, 144, 146, and 149 provided therebelow, are formed. The first gate insulator 141 is disposed below the fourth semiconductor 151, the second gate insulator 144 is disposed below the first semiconductor 154, the third gate insulator 149 is disposed below the second semiconductor 159, and the fourth gate insulator 146 is disposed below the third semiconductor 156. The first gate insulator 141 may not be connected with the third gate insulator 149.

Next, referring to FIG. 17 to FIG. 20, a plurality of gate conductors are formed by etching the gate conductive layer 120 using the mask patterns 50F and 50H as etching masks. In this case, isotropic etching, for example, wet-etching or plasma etching, may be used. In the etching process, the gate conductive layer 120 is undercut. That is, the gate conductive layer 120 under the mask patterns 50F and 50H are partially etched to an inner side of the edges of the gate insulators 141, 144, 146, and 149. Thus, the outer edge of the gate conductor is recessed in an inner side of edges of the gate insulators 141, 144, 146, and 149 rather than being aligned with the edges of the gate insulators 141, 144, 146, and 149. That is, the outer edge of the gate conductor is recessed by a predetermined distance from the edge sides of the gate insulators 141, 144, 146, and 149. The gate conductor may include a gate line 121 provided below the first gate insulator 141, the gate electrodes 124 and 124A provided below the second gate insulator 144, the common voltage line 126 provided below the fourth gate insulator 146, and the end portion 129 of the gate line 121 provided below the third gate insulator 149.

Next, referring to FIG. 21 to FIG. 24, the second mask pattern 50H is removed by partially etching the mask patterns 50F and 50H. In this case, the first mask pattern 50F is also partially etched such that a third mask pattern 50f is formed. The height and the width of the third mask pattern 50f may be smaller than those of the first mask pattern 50F. Accordingly, the fourth semiconductor 151 among the plurality of semiconductor patterns is exposed.

Next, the fourth semiconductor 151, which is an exposed semiconductor pattern is removed by etching using the third mask pattern 50f as an etching mask. In this case, the first gate insulator 141 may be partially etched.

Next, referring to FIG. 25 to FIG. 28, the common electrode layer 130 is formed by laminating a transparent conductive material such as ITO, IZO, and the like on the entire surface of the first substrate 110. Next, the first insulating layer 160 is formed by laminating an inorganic insulating material such as SiNx, SiOx, and the like on the common electrode layer 130.

The common electrode layer 130 and the first insulating layer 160 that are sequentially laminated include a first portion disposed on an upper surface and/or a side surface of the third mask pattern 50f and a second portion separated from the first portion. That is, the common electrode layer 130 and the first insulating layer 160 are disconnected at an edge portion of the third mask pattern 50f due to the height of the third mask pattern 50f such that a gap OP is formed.

Figure 25:
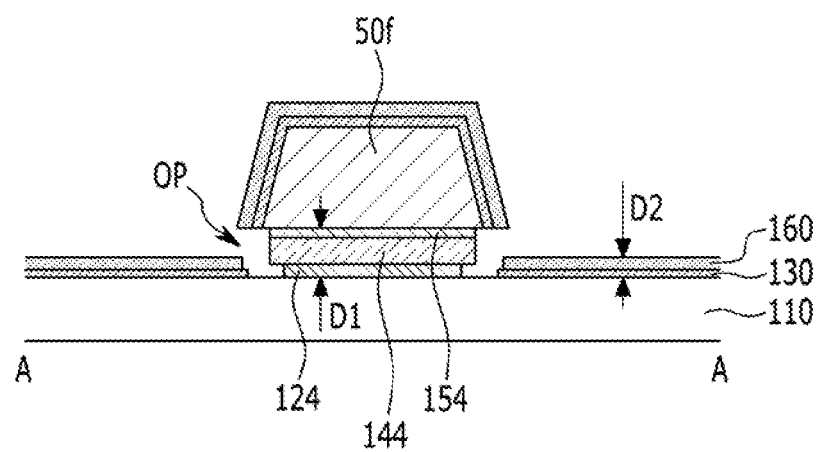
FIG. 25, FIG. 26, FIG. 27 and FIG. 28 are cross-sectional views respectively illustrating the intermediate product in a stage after the stage of FIG. 21, FIG. 22, FIG. 23, and FIG. 24 of the manufacturing process according to the exemplary embodiment of the present inventive concept, taken along the lines of A-A, B-B, C-C, and D-D of FIG. 1 to FIG. 3.
Figure 26:
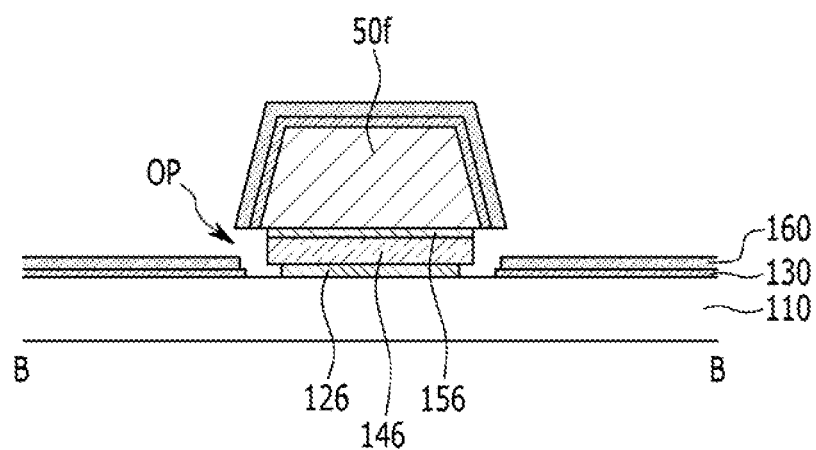
Figure 27:
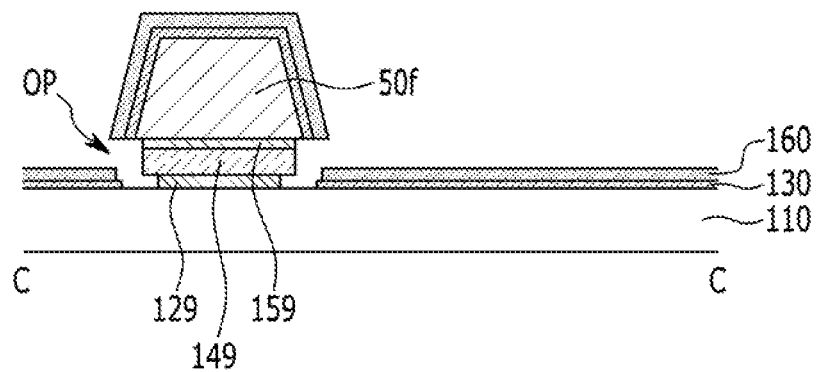
Figure 28:
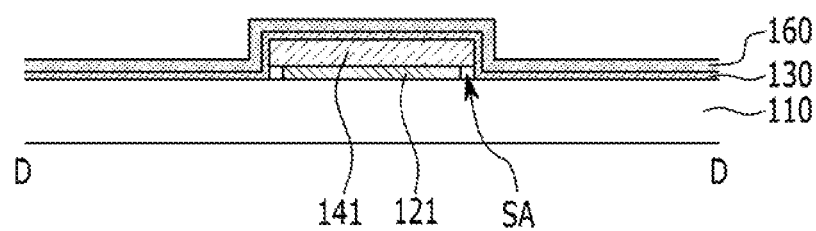
Figure 29:
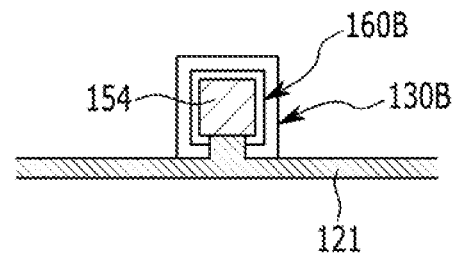
FIG. 29 is a top plan view of the intermediate product in a stage after the stage of FIG. 25, FIG. 26, FIG. 27, and FIG. 28.
Figure 30:
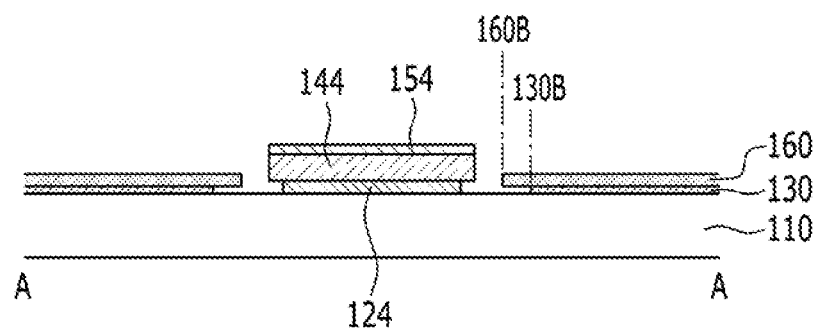
FIG. 30, FIG. 31, and FIG. 32 are cross-sectional views respectively illustrating the intermediate product in a stage after the stage of FIG. 25, FIG. 26, FIG. 27, and FIG. 28 of the manufacturing process according to the exemplary embodiment of the present inventive concept, taken along the lines of A-A, B-B, and C-C of FIG. 1 to FIG. 3.
Figure 31:
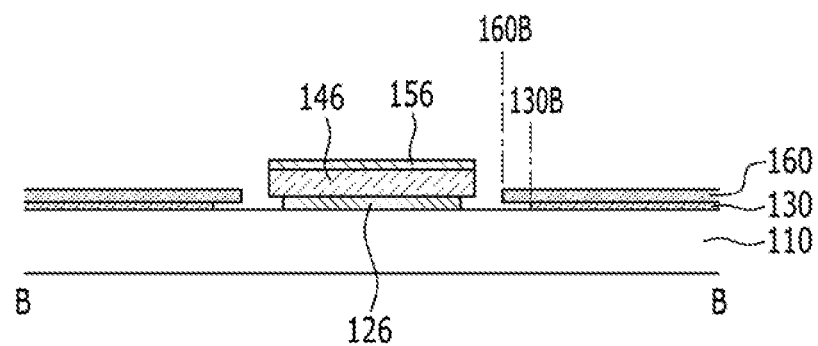
Figure 32:
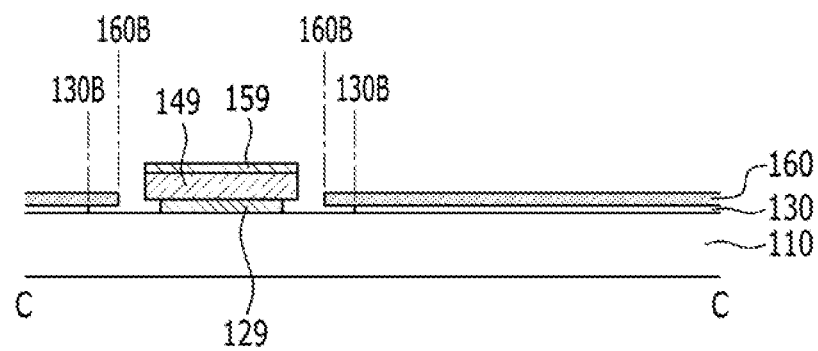

The second portion of the common electrode layer 130 and the first insulating layer 160 include a portion that is directly formed on the first substrate 110 as shown in FIG. 25 to FIG. 27 and a portion that is directly formed on the first gate insulator 141 as shown in FIG. 28. Referring to FIG. 28, edge sides of the gate line 121 are positioned at an inner side of the edge sides of the first gate insulator 141, and therefore a space SP is formed at the periphery of the gate line 121 by the common electrode layer 130 and the first insulating layer 160 that are layered on the gate line 121. The space SA is covered by the first gate insulator 141.

Referring to FIG. 25 to FIG. 27, the third mask pattern 50f is separated by the gap OP such that the edges of the common electrode layer 130 and the first insulating layer 160 are separated from the semiconductors 154, 156, and 159 and the gate conductor therebelow.

A thickness D1 of the sequentially laminated gate conductors 124 and 129, the gate insulators 144 and 149, and the semiconductors 154 and 159 may be greater than a thickness D2 of the sequentially laminated common electrode layer 130 and the first insulating layer 160. Thus, the gap OP of the common electrode layer 130 and the first insulating layer 160 can be easily formed.

Next, referring to FIG. 29 to FIG. 32, the third mask pattern 50f and the common electrode layer 130 and the first insulating layer 160 formed on the third mask pattern 50f are removed, for example, using a lift-off process using a wet process such as developing process. An island-shaped hole exposing the gate electrodes 124 and 124A, the common electrode 154, and a peripheral area thereof, an island-shaped hole exposing an end portion of the gate line 121, the semiconductor 159, and a peripheral area thereof, and an island-shaped hole exposing a part of the common voltage line 126, the semiconductor 156, and a peripheral area thereof are formed in the common electrode layer 130 and the first insulating layer 160. The island-shaped hole formed in the first insulating layer 160 includes an edge 160b facing the semiconductors 154, 156, and 159.

Next, a part of the common electrode layer 130 provided in the periphery of the edge side 160B of the first insulating layer 160 is etched such that the edge 130B of the common electrode layer 130 is recessed from the edge 160B of the first insulating layer 160 to an inner side of the edge side 160B. In this case, an isotropic etching technique such as a wet-etching technique may be used. A distance between the edge 130B of the common electrode layer 130 and the edge 160B of the first insulating layer 160 may be properly adjusted.

The holes in the common electrode layer 130 respectively correspond to the holes formed in the first insulating layer 160. The holes of the common electrode layer 130 includes an edge 130B disposed at an outer side of the edge 160B of the first insulating layer 160 and surrounding the edge 160B.

Figure 33:
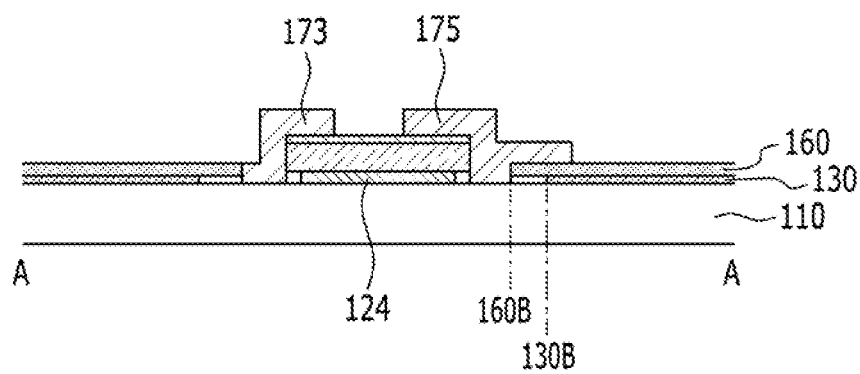
FIG. 33, FIG. 34, and FIG. 35 are cross-sectional views respectively illustrating the intermediate product in a stage after the stage of FIG. 30, FIG. 31, and FIG. 32 of the manufacturing process according to the exemplary embodiment of the present inventive concept, taken along the lines of A-A, B-B, and C-C of FIG. 1 to FIG. 3.
Figure 34:
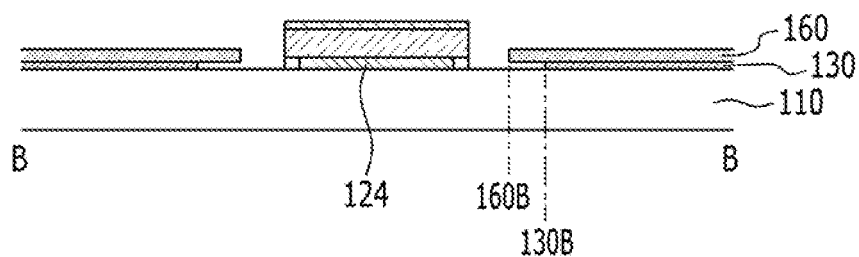
Figure 35:
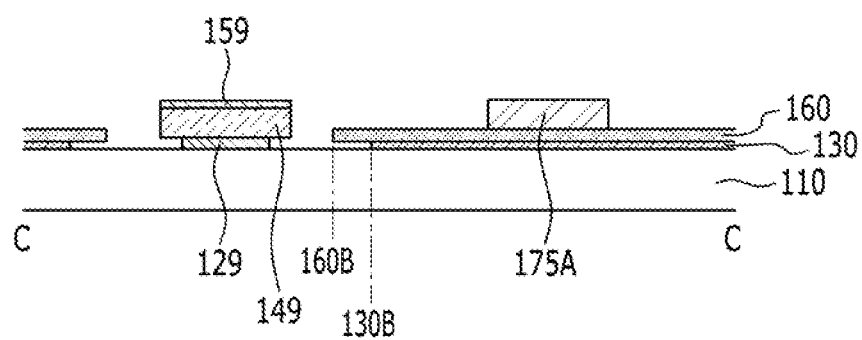
Figure 36:
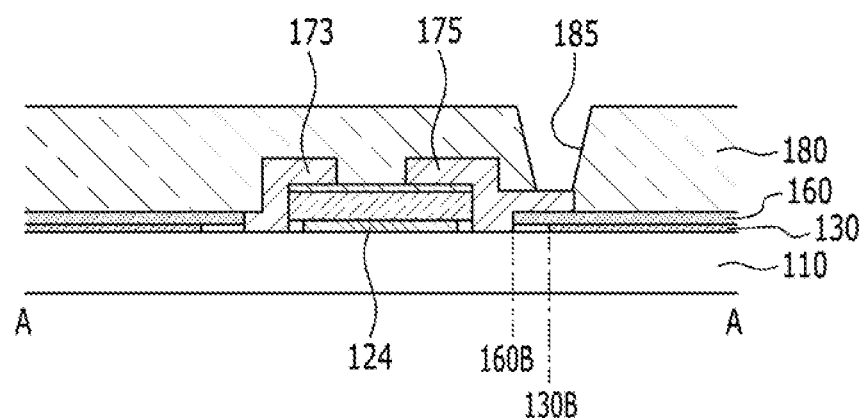
FIG. 36, FIG. 37, FIG. 38, and FIG. 39 are cross-sectional views respectively illustrating the intermediate product in a stage after the stage of FIG. 33, FIG. 34, and FIG. 35 of the manufacturing process according to the exemplary embodiment of the present inventive concept, taken along the lines of A-A, B-B, C-C, and D-D of FIG. 1 to FIG. 3.
Figure 37:
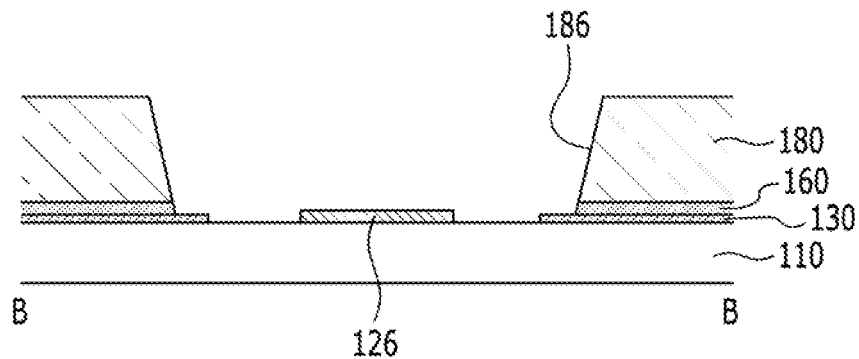
Figure 38:
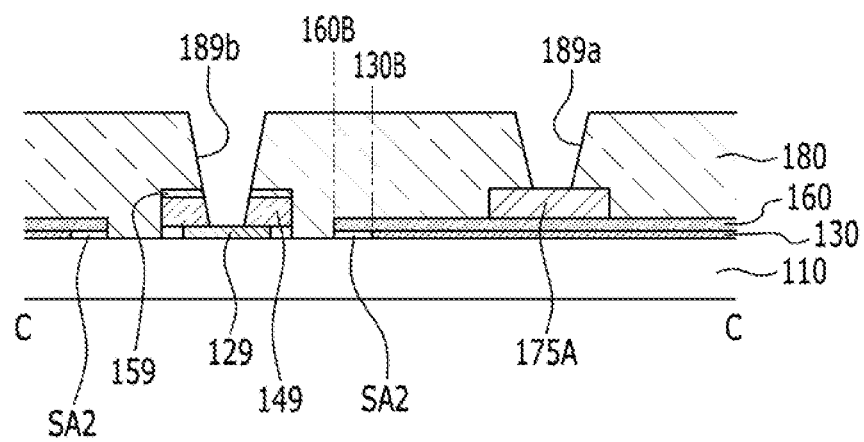
Figure 39:
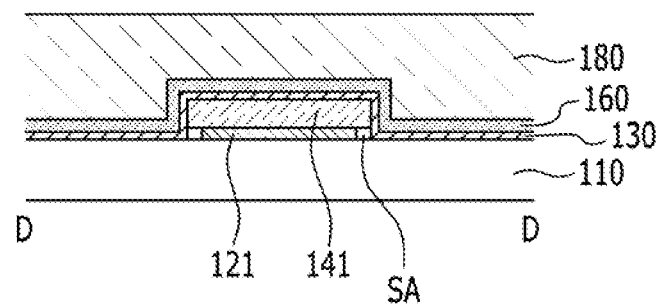

Next, referring to FIG. 33 to FIG. 35, a conductive material such as a metal is laminated on the first insulating layer 160 and then patterned such that a data conductor including the data line 171, source electrodes 173 and 173A, and drain electrodes 175 and 175A is formed. In this case, a photosensitive material such as a photoresist and the like is formed on the first insulating layer 160 and exposed using a single second photo-mask to form a mask pattern.

Next, referring to FIG. 36 to FIG. 39, an inorganic insulating material or an organic insulating material is layered on the data conductor to form a second insulating layer 180. Subsequently, the contact holes 185, 186, 189a, and 189b are formed by patterning the second insulating layer 180 and the first insulating layer 160. In this case, the mask pattern may be formed through an exposure process using a single third photo-mask. A semiconductor pattern and a gate insulator provided below the second insulating layer 180 that is exposed rather than being covered by the mask pattern can also be removed. For example, the contact hole 189b extends to the second semiconductor 159 and the third gate insulator 149 such that an end portion 129 of the gate line 121 may be exposed.

Figure 40:
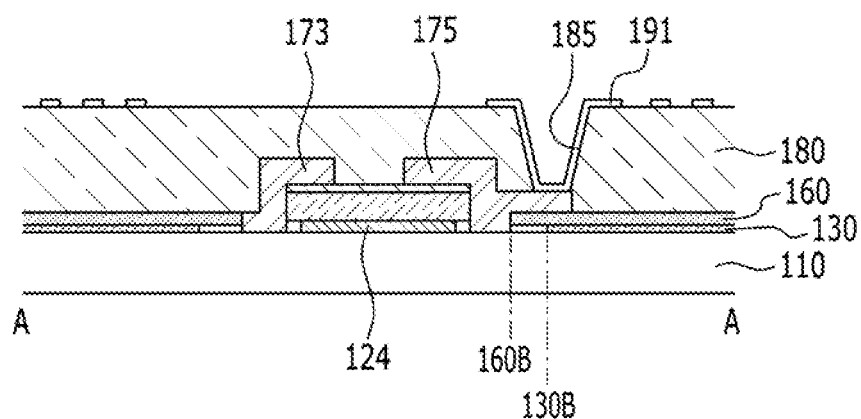
FIG. 40, FIG. 41, and FIG. 42 are cross-sectional views respectively illustrating the intermediate product in a stage after the stage of FIG. 36, FIG. 37, FIG. 38, and FIG. 39 of the manufacturing process according to the exemplary embodiment of the present inventive concept, taken along the lines of A-A, B-B, and C-C of FIG. 1 to FIG. 3.
Figure 41:
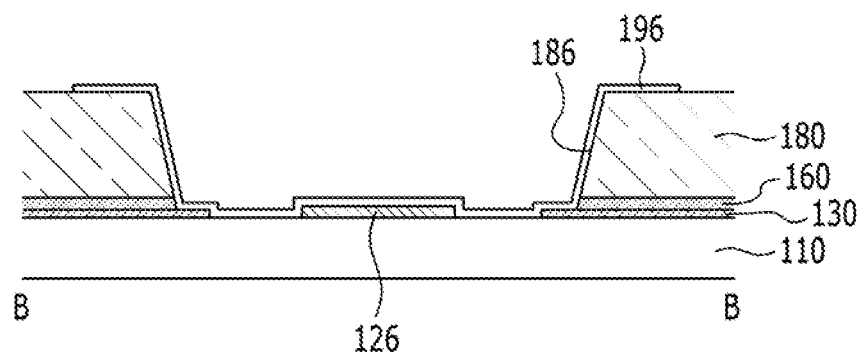
Figure 42:
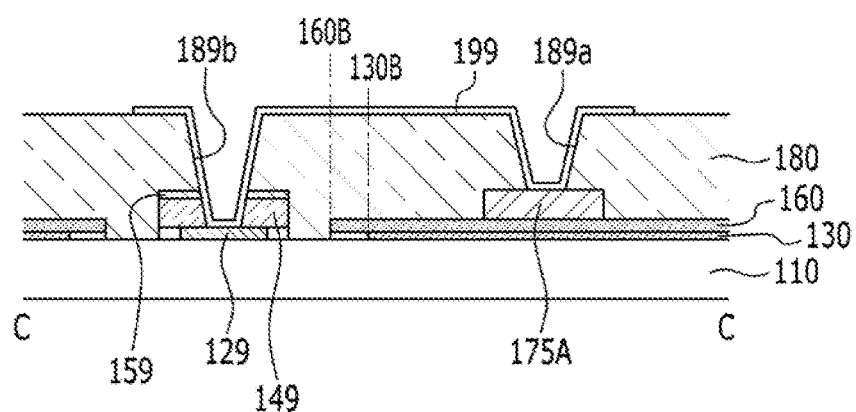

Next, referring to FIG. 40 to FIG. 42, a transparent conductive material such as ITO, IZO, and the like is laminated on the second insulating layer 180 and then patterned such that a pixel electrode layer including a plurality of pixel electrodes 191 and a plurality of connection members 196 and 199 is formed. In this case, an exposure process using a single fourth photo-mask may be used.

Figure 43:
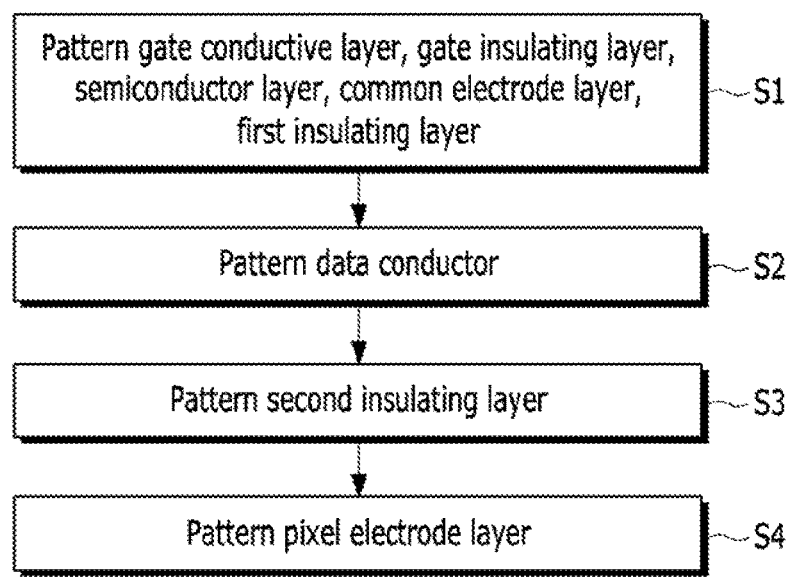
FIG. 43 is a schematic flowchart of a manufacturing method of a display device according to an exemplary embodiment of the present inventive concept.

Referring to FIG. 43, the number of exposure processes used in the manufacturing process of the lower panel 100 according to the exemplary embodiment of the present inventive concept can be reduced to four. That is, a single first photo-mask 90 is used in patterning (S1) of the gate conductive layer 120, the gate insulating layer 140, the semiconductor layer 150, the common electrode layer 130, and the first insulating layer 160, a single second photo-mask is used in patterning (S2) of the data conductor, a single third photo-mask is used in patterning (S3) of the second insulating layer 180, and a single fourth photo-mask may be used in patterning (S4) of the pixel electrode layer.

Accordingly, the number of exposure processes and the number of photo-masks used in the manufacturing process of the display device can be reduced, thereby simplifying the manufacturing process and reducing manufacturing cost.

Further, since the semiconductor pattern such as the first semiconductor 154 and the like is formed only in an area where the gate conductor and the like is formed, the semiconductor pattern is not formed in an undesired area. Accordingly, a display failure such as waterfall that is displayed when the semiconductor is exposed to light can be prevented, and an afterimage due to a light leakage current can be prevented.

While this inventive concept has been described in connection with what is presently considered to be practical exemplary embodiments, it is to be understood that the inventive concept is not limited to the disclosed embodiments, but, on the contrary, is intended to cover various modifications and equivalent arrangements included within the spirit and scope of the appended claims.

What is claimed is:

1. A display device comprising:
   a substrate;
   a gate electrode disposed on the substrate;
   a common electrode layer disposed on the substrate;
   a gate insulator disposed on the gate electrode, the gate insulator not overlapping the common electrode layer in a first direction perpendicular to a surface of the substrate;
   a first insulating layer disposed on the common electrode layer, the first insulating layer not overlapping the gate electrode in the first direction;
   a semiconductor disposed on the gate insulator;
   a source electrode and a drain electrode which are disposed on the semiconductor;
   a second insulating layer disposed on the source electrode, the drain electrode and the first insulating layer; and
   a pixel electrode disposed on the second insulating layer and overlapping the common electrode,
   wherein any semiconductor is not disposed between the first insulating layer and the second insulating layer.

2. The display device of claim 1, wherein:
   a total thickness of the gate electrode, the gate insulator, and the semiconductor is greater than a total thickness of the common electrode layer and the first insulating layer.

3. The display device of claim 1, wherein:
   the gate electrode, the gate insulator, and the semiconductor are separated from an edge of the first insulating layer with a space therebetween.

4. The display device of claim 3, wherein:
   at least one of the source electrode and the drain electrode includes a portion disposed in the space.

5. The display device of claim 4, wherein:
   the source electrode and the drain electrode contact a lateral surface of the gate insulator and are separated from the gate electrode.

6. The display device of claim 4, wherein:
   the source electrode and the drain electrode contact a lateral surface of the first insulating layer and are separated from the common electrode layer.

7. The display device of claim 4, wherein:
   the portion of the at least one of the source electrode and the drain electrode contacts the substrate.

8. The display device of claim 1, wherein:
   the first insulating layer does not overlap the gate insulator in the first direction.

9. The display device of claim 1, wherein:
   the first insulating layer covers an outer area provided at a periphery of the common electrode layer.

10. The display device of claim 9, wherein:
    an edge of the common electrode layer is separated from and substantially parallel with an edge of the first insulating layer in a plan view.

11. The display device of claim 1, wherein:
    the gate insulator covers an outer area provided at a periphery of the gate electrode.

12. The display device of claim 11, wherein:
    an edge of the gate electrode is separated from and substantially parallel with an edge of the gate insulator in a plan view.

13. The display device of claim 1, wherein:
    an edge of the semiconductor is aligned with an edge of the gate insulator.

14. The display device of claim 1, wherein:
    the common electrode layer contacts the substrate.

15. A display device comprising:
    a substrate;

a gate electrode and a common electrode layer which are disposed on the substrate and separated from each other;
a gate insulator disposed on the gate electrode;
a first insulating layer disposed on the common electrode layer;
a semiconductor disposed on the gate insulator;
a source electrode and a drain electrode which are disposed on the semiconductor;
a second insulating layer disposed on the source electrode, the drain electrode and the first insulating layer,
wherein a first stacked structure of the gate electrode, the gate insulator, and the semiconductor is spaced apart from a second stacked structure of the common electrode layer and the first insulating layer with a space therebetween,
wherein any semiconductor is not disposed between the first insulating layer and the second insulating layer.

16. The display device of claim 15, wherein:
a thickness of the first stacked structure is greater than a thickness of the second stacked structure.

17. The display device of claim 15, wherein:
at least one of the source electrode and the drain electrode includes a portion disposed in the space.

18. The display device of claim 17, wherein:
the portion of the at least one of the source electrode and the drain electrode contacts the substrate.

19. The display device of claim 17, wherein:
the source electrode and the drain electrode contact a lateral surface of the gate insulator and are separated from the gate electrode.

20. The display device of claim 17, wherein:
the source electrode and the drain electrode contact a lateral surface of the first insulating layer and are separated from the common electrode layer.

* * * * *